US012633349B2

(12) United States Patent
Steiner et al.

(10) Patent No.: US 12,633,349 B2
(45) Date of Patent: May 19, 2026

(54) SYSTEM AND METHOD FOR IMPROVED ENDURANCE IN NON-VOLATILE MEMORY SYSTEMS

(71) Applicant: Kioxia Corporation, Tokyo (JP)

(72) Inventors: Avi Steiner, Tel Aviv (IL); Alex Britva, Tel Aviv (IL); Liran Kost, Tel Aviv (IL); Eyal Nitzan, Tel Aviv (IL); Hanan Weingarten, Tel Aviv (IL); Yasuhiko Kurosawa, Kanagawa (JP); Yasuyuki Ushijima, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 98 days.

(21) Appl. No.: 18/612,211

(22) Filed: Mar. 21, 2024

(65) Prior Publication Data

US 2025/0299738 A1     Sep. 25, 2025

(51) Int. Cl.
*G11C 16/10*     (2006.01)
*G11C 16/32*     (2006.01)
*G11C 16/34*     (2006.01)

(52) U.S. Cl.
CPC ............ *G11C 16/102* (2013.01); *G11C 16/32* (2013.01); *G11C 16/3404* (2013.01)

(58) Field of Classification Search
CPC ... G11C 16/102; G11C 16/32; G11C 16/3404; G11C 11/5628; G11C 16/0483; G11C 16/10; G11C 16/3459
See application file for complete search history.

(56) References Cited

U.S. PATENT DOCUMENTS

| | | | | |
|---|---|---|---|---|
| 9,218,886 B2 * | 12/2015 | Dusija | ............... | G11C 16/0408 |
| 9,524,784 B1 * | 12/2016 | Cheng | ................... | H10B 43/27 |
| 10,473,397 B2 * | 11/2019 | College | ................. | F26B 23/002 |
| 2010/0165740 A1 * | 7/2010 | Nagashima | .......... | G11C 29/028 |
| | | | | 365/185.19 |
| 2017/0287568 A1 * | 10/2017 | Yang | ................. | G11C 16/3418 |
| 2018/0082751 A1 * | 3/2018 | Umezawa | .............. | G11C 5/147 |
| 2018/0150224 A1 * | 5/2018 | You | ..................... | G06F 13/1668 |
| 2020/0402580 A1 * | 12/2020 | Kim | ....................... | G06F 3/0656 |
| 2022/0084595 A1 * | 3/2022 | Kusaka | ................. | G11C 16/08 |
| 2022/0093195 A1 * | 3/2022 | Shim | ..................... | G11C 16/12 |
| 2022/0199183 A1 * | 6/2022 | Steiner | .................. | G11C 16/26 |
| 2022/0293186 A1 * | 9/2022 | Lee | ......................... | G11C 16/14 |
| 2022/0406380 A1 * | 12/2022 | Penzo | .................. | G11C 16/349 |

* cited by examiner

*Primary Examiner* — Jay W. Radke
(74) *Attorney, Agent, or Firm* — Foley & Lardner LLP

(57)     ABSTRACT
A system may include one or more processors. The one or more processors may be configured to determine, using first data relating to a sample set of non-volatile memory devices, one or more program parameters of each of a plurality of rows of cells of a non-volatile memory. The one or more processors may be configured to adjust, using the first data, the one or more program parameters of each of the plurality of rows by equalizing the one or more program parameters across the plurality of rows. The one or more processors may be configured to determine one or more programming voltages of each row based at least in part on the adjusted program parameters of the plurality of rows. The one or more processors may be configured to program a first row of the plurality of rows using the one or more programming voltages of the first row.

19 Claims, 27 Drawing Sheets

500

500

500

500

550

| Rows | 0-2 | 3-40 | 41-70 | 71-88 | 89-101 | 102-400 | 401-430 | 430-555 | 556-660 | 661-700 | 701-790 | 791-888 | 889-999 | 1000-1022 | 1023-1099 | 1100-1104 |
|---|---|---|---|---|---|---|---|---|---|---|---|---|---|---|---|---|
| PV S1V | -35 | -28 | -24 | -20 | -15 | -17 | -11 | -22 | -19 | -17 | -15 | -12 | -10 | -11 | -11 | -14 |
| PV S2V | -35 | -28 | -24 | -20 | -15 | -17 | -11 | -22 | -19 | -17 | -15 | -12 | -10 | -11 | -11 | -14 |
| PV S3V | -35 | -28 | -24 | -20 | -15 | -17 | -11 | -22 | -19 | -17 | -15 | -12 | -10 | -11 | -11 | -14 |
| PV S4V | -35 | -28 | -24 | -20 | -15 | -17 | -11 | -22 | -19 | -17 | -15 | -12 | -10 | -11 | -11 | -14 |
| PV S5V | -35 | -28 | -24 | -20 | -13 | -15 | -9 | -21 | -18 | -15 | -13 | -10 | -9 | -10 | -9 | -12 |
| PV S6V | -35 | -28 | -24 | -20 | -13 | -15 | -9 | -21 | -18 | -15 | -13 | -10 | -9 | -10 | -9 | -12 |
| PV S7V | -32 | -25 | -22 | -18 | -11 | -13 | -8 | -20 | -18 | -14 | -12 | -9 | -8 | -8 | -7 | -9 |
| PV S8V | -32 | -25 | -22 | -18 | -11 | -13 | -8 | -20 | -18 | -14 | -12 | -9 | -8 | -8 | -7 | -9 |
| PV S9V | -32 | -25 | -22 | -18 | -10 | -12 | -8 | -20 | -18 | -14 | -12 | -9 | -8 | -8 | -7 | -9 |
| PV S10V | -30 | -23 | -20 | -17 | -8 | -10 | -8 | -17 | -16 | -12 | -10 | -7 | -7 | -7 | -7 | -7 |
| PV S11V | -28 | -21 | -18 | -15 | -7 | -9 | -7 | -17 | -16 | -12 | -10 | -7 | -7 | -7 | -7 | -7 |
| PV S12V | -28 | -21 | -18 | -15 | -7 | -9 | -7 | -17 | -16 | -12 | -10 | -7 | -7 | -7 | -7 | -7 |
| PV S13V | -28 | -21 | -18 | -15 | -7 | -9 | -7 | -17 | -16 | -12 | -10 | -7 | -7 | -7 | -7 | -7 |
| PV S14V | -28 | -21 | -18 | -15 | -7 | -9 | -7 | -17 | -16 | -12 | -10 | -7 | -7 | -7 | -7 | -7 |
| PV S15V | -28 | -21 | -18 | -15 | -7 | -9 | -7 | -17 | -16 | -12 | -10 | -7 | -7 | -7 | -7 | -7 |

Table 1

FIG. 5C

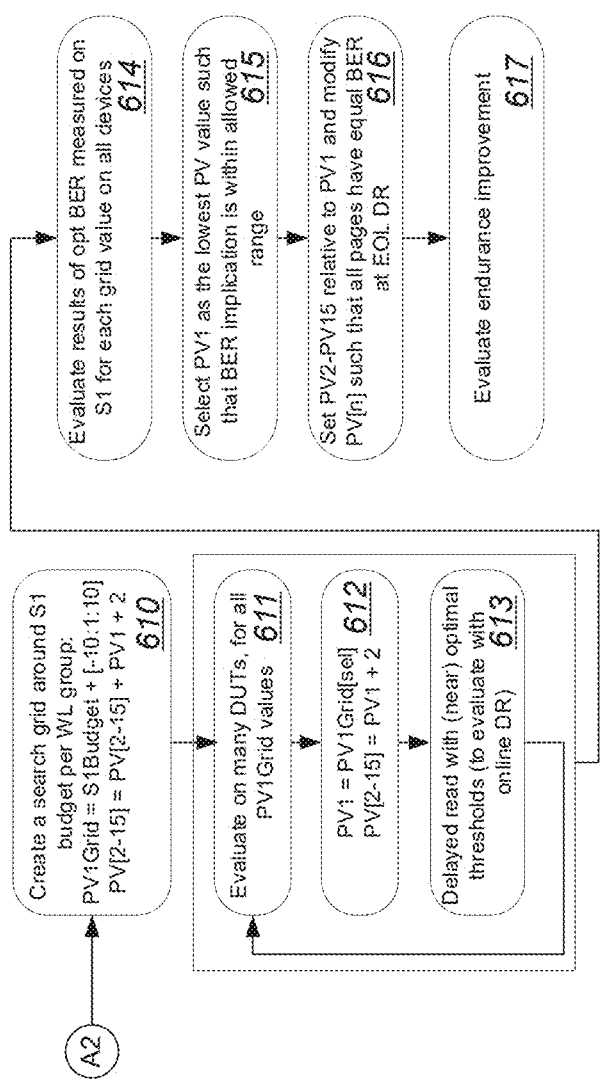

Create a search grid around S1
budget per WL group:
PV1Grid = S1Budget + [-10:1:10]
PV[2-15] = PV[2-15] + PV1 + 2
*610*

Evaluate on many DUTs, for all
PV1Grid values *611*

PV1 = PV1Grid[sel]
PV[2-15] = PV1 + 2 *612*

Delayed read with (near) optimal
thresholds (to evaluate with
online DR) *613*

Evaluate results of opt BER measured on
S1 for each grid value on all devices.
*614*

Select PV1 as the lowest PV value such
that BER implication is within allowed
range *615*

Set PV2-PV15 relative to PV1 and modify
PV[n] such that all pages have equal BER
at EOL DR *616*

Evaluate endurance improvement *617*

| Rows: | 0-2 | 3-40 | 41-70 | 71-88 | 89-101 | 102-400 | 401-430 | 430-555 | 556-660 | 661-700 | 701-790 | 791-888 | 889-999 | 1000-1022 | 1023-1099 | 1100-1108 |
|---|---|---|---|---|---|---|---|---|---|---|---|---|---|---|---|---|
| ISPP | 1 | -2 | -1 | -1 | -1 | -1 | -2 | -1 | -1 | 0 | -2 | -1 | -1 | -2 | 1 | 0 |
| NPP | 0 | 4 | 2 | 3 | 3 | 3 | 4 | 2 | 3 | 0 | 4 | 2 | 3 | 4 | -2 | 0 |
| VPGM | 0 | -1 | 0 | -1 | -1 | -1 | -1 | 0 | -1 | 0 | -1 | 0 | -1 | -2 | 1 | 0 |
| PV S1V | -35 | -28 | -24 | -20 | -15 | -17 | -11 | -22 | -19 | -17 | -15 | -12 | -10 | -11 | -11 | -14 |
| PV S2V | -35 | -28 | -24 | -20 | -15 | -17 | -11 | -22 | -19 | -17 | -15 | -12 | -10 | -11 | -11 | -14 |
| PV S3V | -35 | -28 | -24 | -20 | -15 | -17 | -11 | -22 | -19 | -17 | -15 | -12 | -10 | -11 | -11 | -14 |
| PV S4V | -35 | -28 | -24 | -20 | -15 | -17 | -11 | -22 | -19 | -17 | -15 | -12 | -10 | -11 | -11 | -14 |
| PV S5V | -35 | -28 | -24 | -20 | -13 | -15 | -9 | -21 | -18 | -15 | -13 | -10 | -9 | -10 | -9 | -12 |
| PV S6V | -35 | -28 | -24 | -20 | -13 | -15 | -9 | -21 | -18 | -15 | -13 | -10 | -9 | -10 | -9 | -12 |
| PV S7V | -32 | -25 | -22 | -18 | -11 | -13 | -8 | -20 | -18 | -14 | -12 | -9 | -8 | -8 | -7 | -9 |
| PV S8V | -32 | -25 | -22 | -18 | -11 | -13 | -8 | -20 | -18 | -14 | -12 | -9 | -8 | -8 | -7 | -9 |
| PV S9V | -32 | -25 | -22 | -18 | -10 | -12 | -8 | -20 | -18 | -14 | -12 | -9 | -8 | -8 | -7 | -9 |
| PV S10V | -30 | -23 | -20 | -17 | -8 | -10 | -7 | -17 | -16 | -12 | -10 | -7 | -7 | -7 | -7 | -7 |
| PV S11V | -28 | -21 | -18 | -15 | -7 | -9 | -7 | -17 | -16 | -12 | -10 | -7 | -7 | -7 | -7 | -7 |
| PV S12V | -28 | -21 | -18 | -15 | -7 | -9 | -7 | -17 | -16 | -12 | -10 | -7 | -7 | -7 | -7 | -7 |
| PV S13V | -28 | -21 | -18 | -15 | -7 | -9 | -7 | -17 | -16 | -12 | -10 | -7 | -7 | -7 | -7 | -7 |
| PV S14V | -28 | -21 | -18 | -15 | -7 | -9 | -7 | -17 | -16 | -12 | -10 | -7 | -7 | -7 | -7 | -7 |
| PV S15V | -28 | -21 | -18 | -15 | -7 | -9 | -7 | -17 | -16 | -12 | -10 | -7 | -7 | -7 | -7 | -7 |

Table 2

FIG. 6C

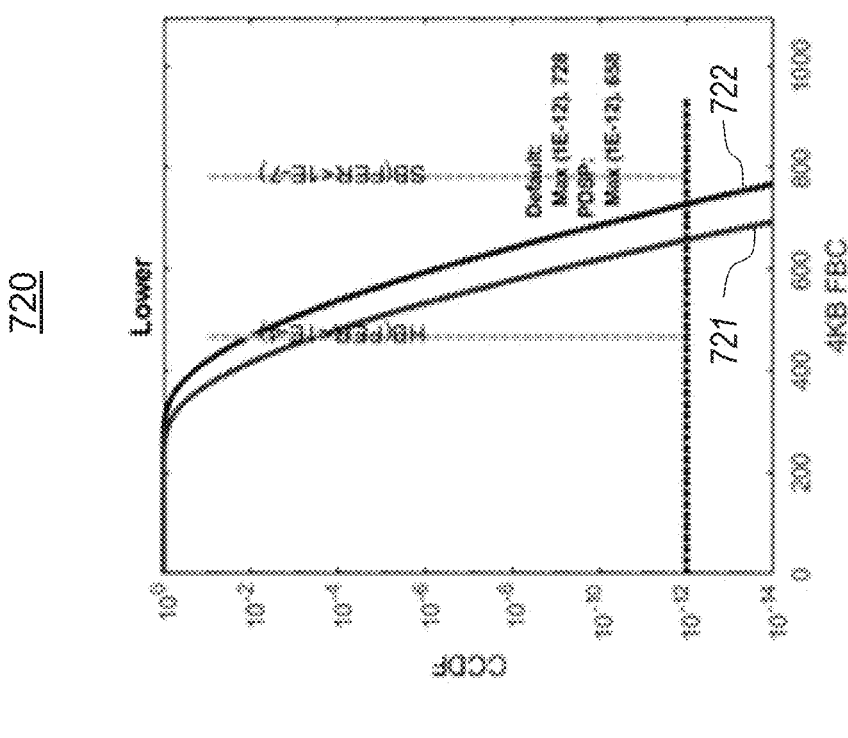
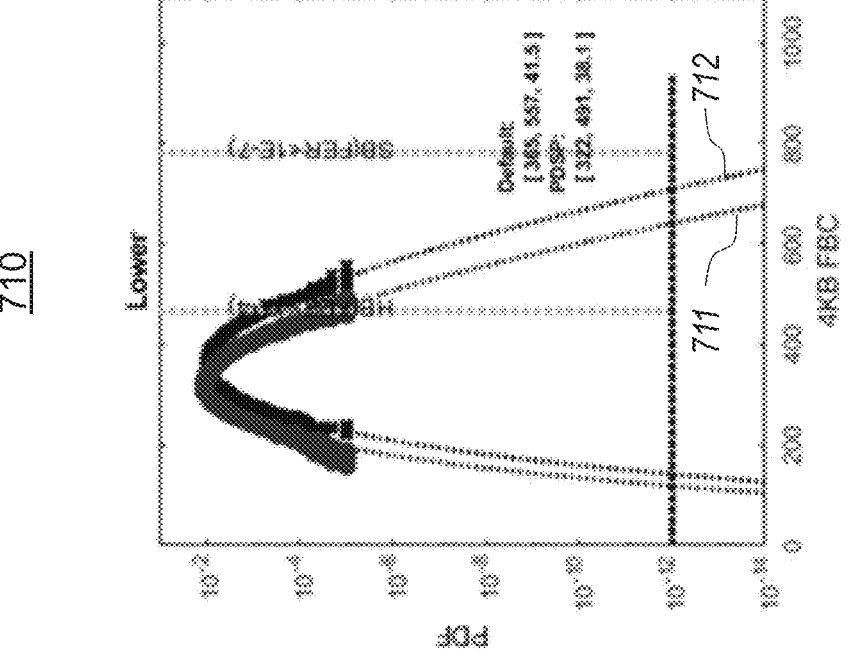
FIG. 7A

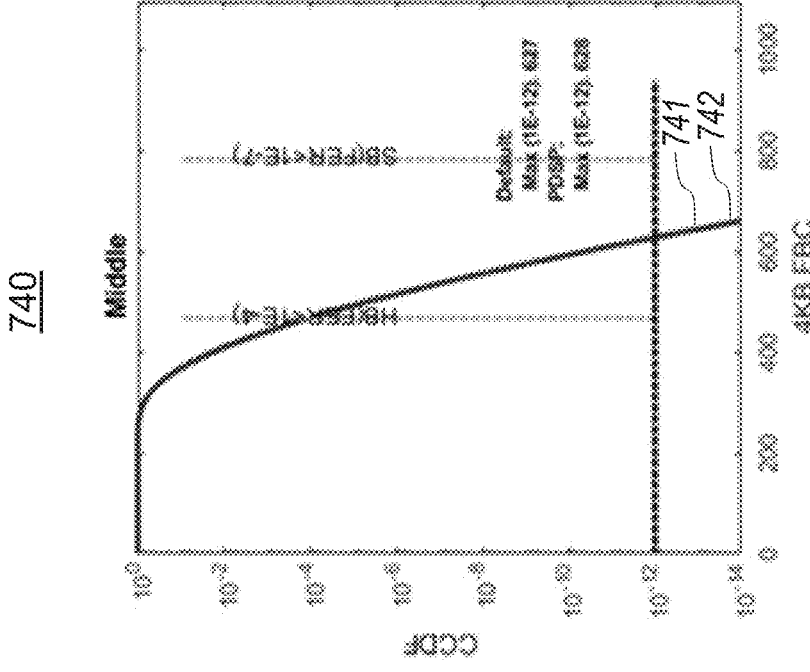
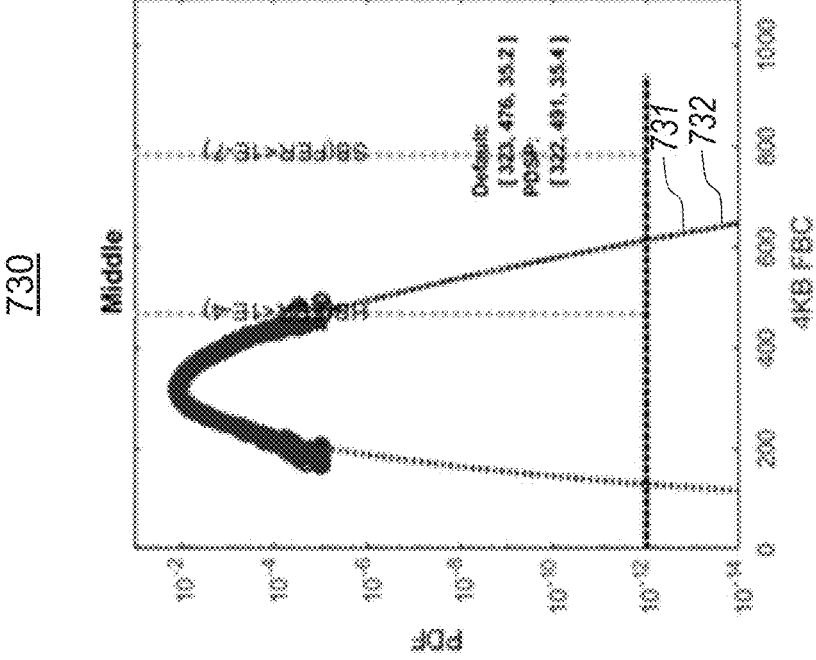
FIG. 7B

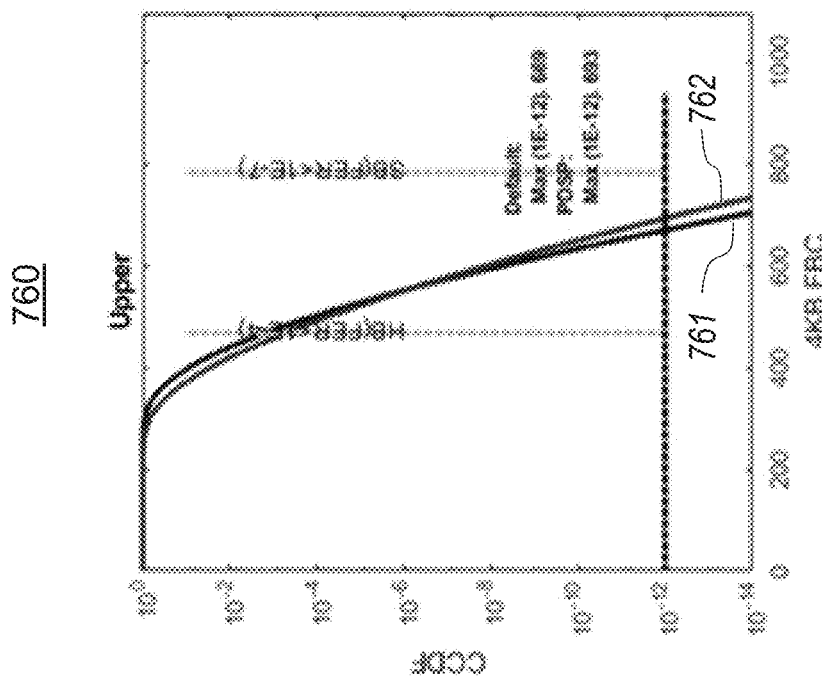
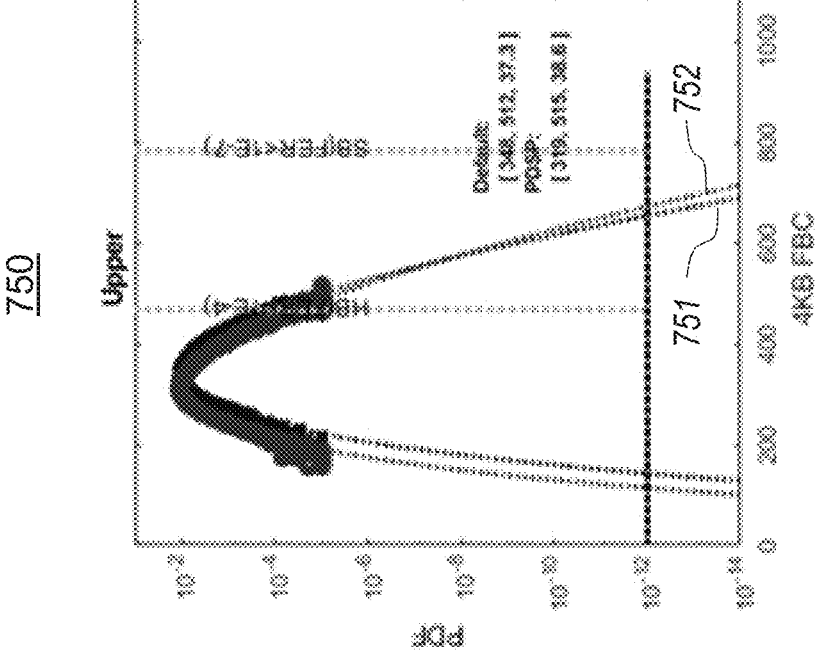
FIG. 7C

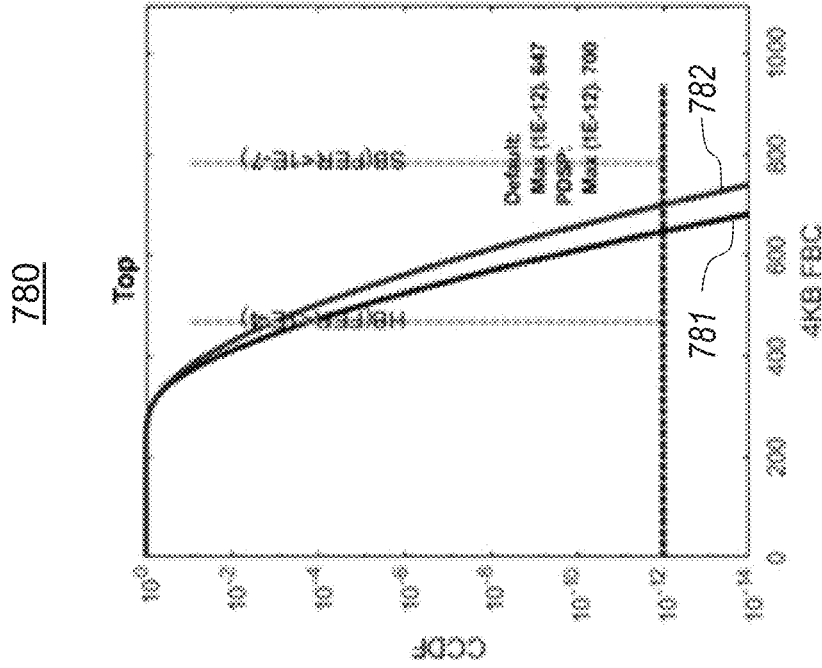
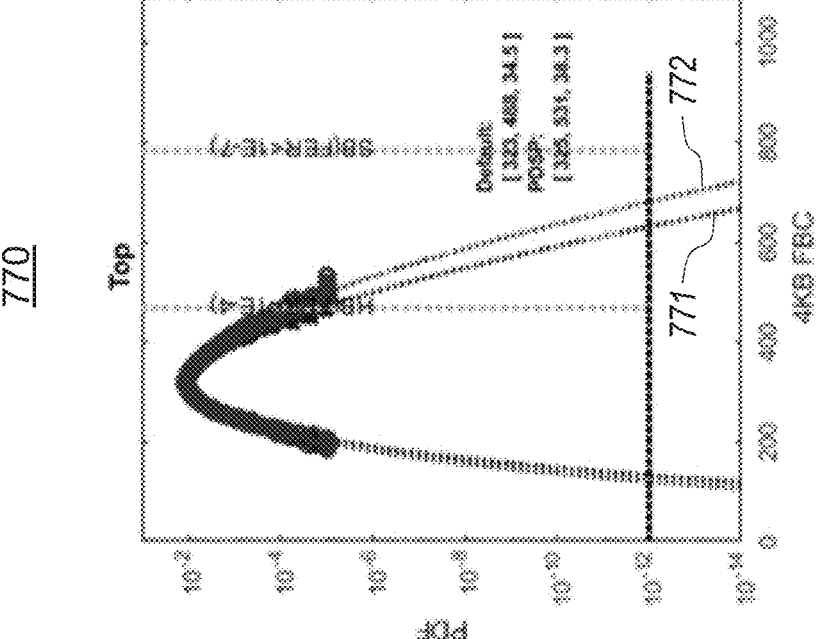
FIG. 7D

900

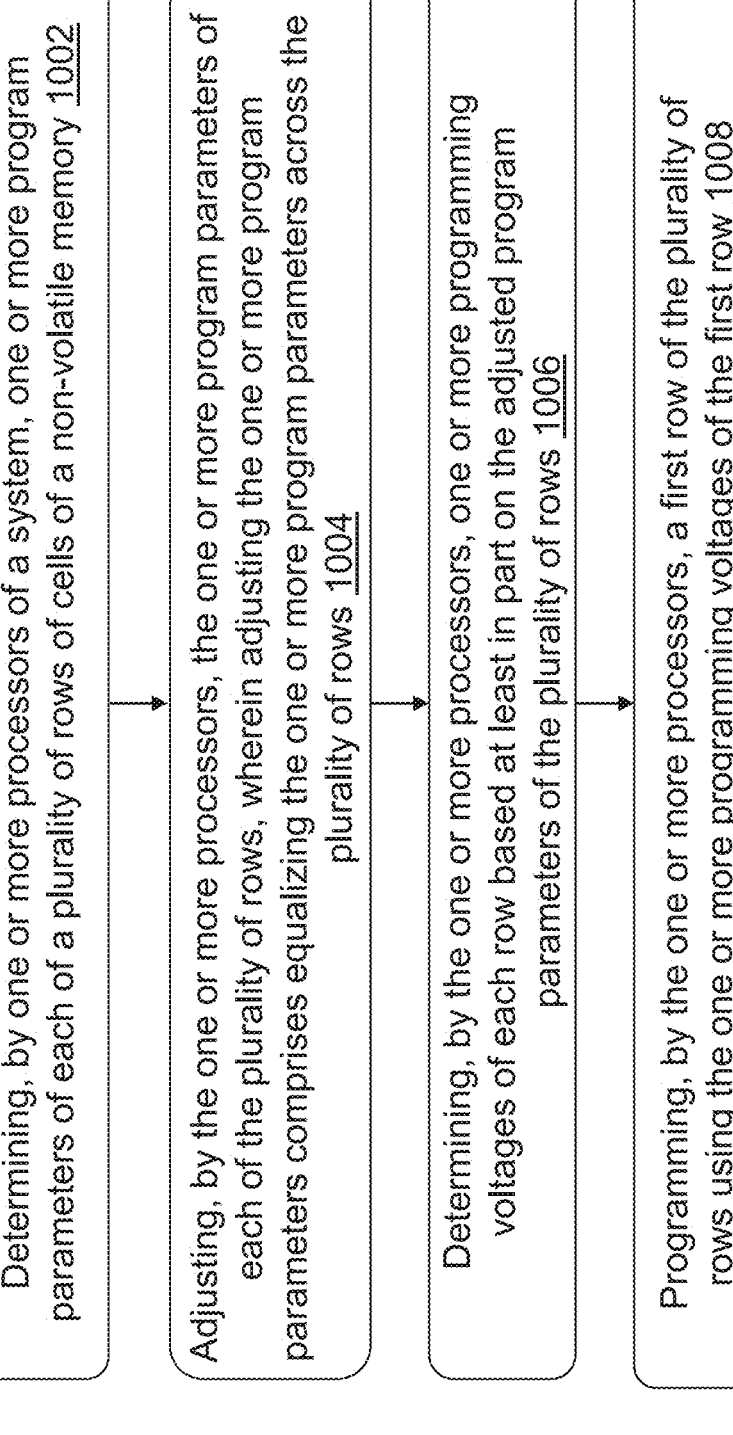

1000

Determining, by one or more processors of a system, one or more program parameters of each of a plurality of rows of cells of a non-volatile memory 1002

Adjusting, by the one or more processors, the one or more program parameters of each of the plurality of rows, wherein adjusting the one or more program parameters comprises equalizing the one or more program parameters across the plurality of rows 1004

Determining, by the one or more processors, one or more programming voltages of each row based at least in part on the adjusted program parameters of the plurality of rows 1006

Programming, by the one or more processors, a first row of the plurality of rows using the one or more programming voltages of the first row 1008

FIG. 10

Performing stability testing 1202

Performing distributed optimization by performing, per device, independent optimization 1204

Selecting optimal candidates 1206

Testing all optimal candidates 1208

Selecting best candidate 1210

1200

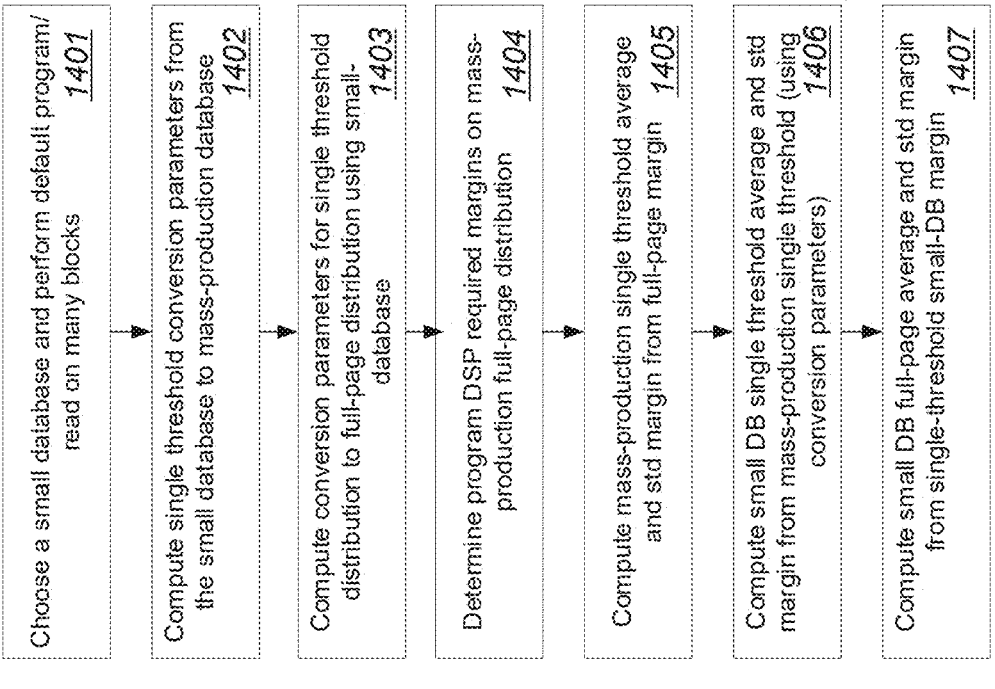

Choose a small database and perform default program/ read on many blocks  *1401*

Compute single threshold conversion parameters from the small database to mass-production database  *1402*

Compute conversion parameters for single threshold distribution to full-page distribution using small-database  *1403*

Determine program DSP required margins on mass-production full-page distribution  *1404*

Compute mass-production single threshold average and std margin from full-page margin  *1405*

Compute small DB single threshold average and std margin from mass-production single threshold (using conversion parameters)  *1406*

Compute small DB full-page average and std margin from single-threshold small-DB margin  *1407*

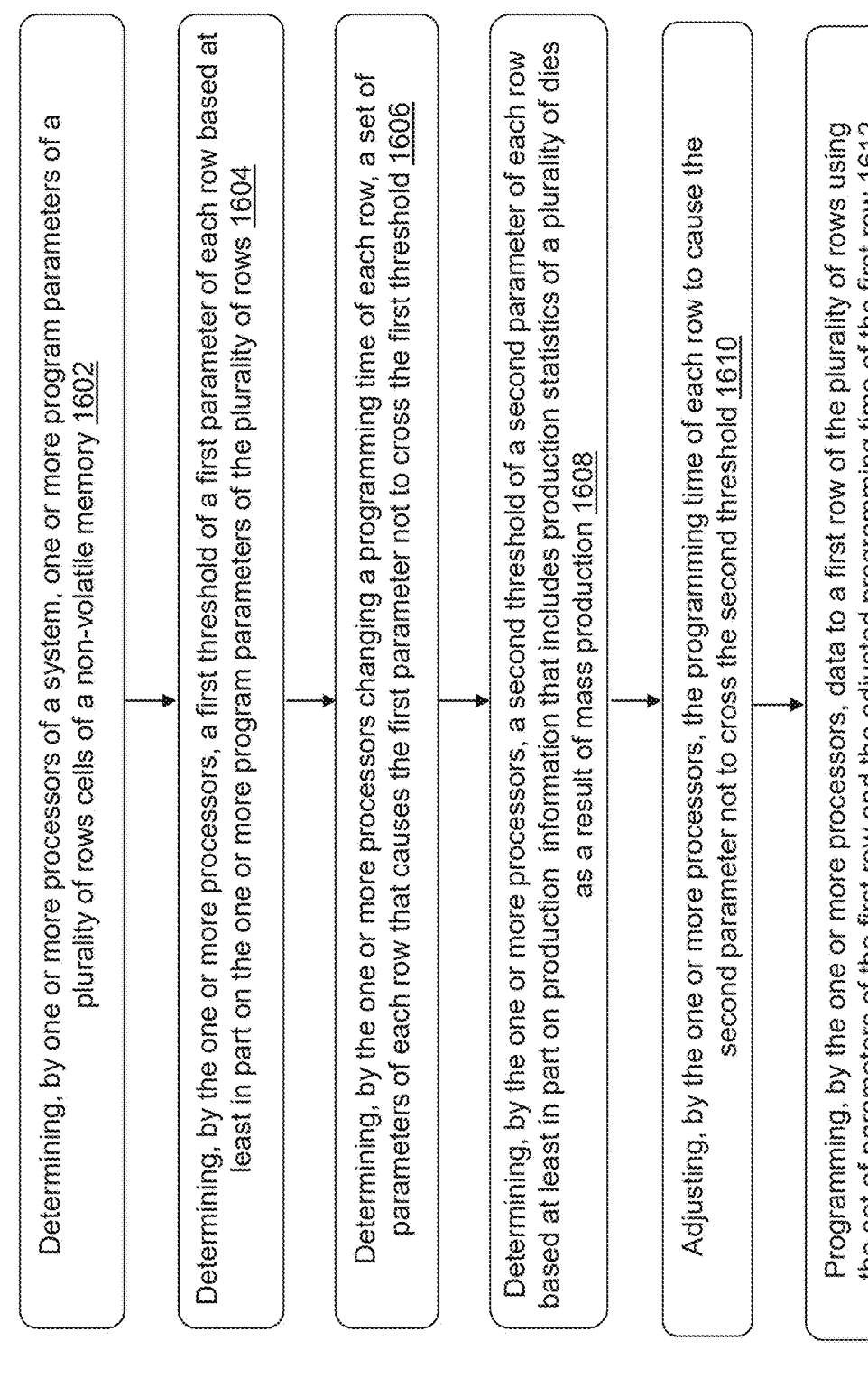

Determining, by one or more processors of a system, one or more program parameters of a plurality of rows cells of a non-volatile memory 1602

Determining, by the one or more processors, a first threshold of a first parameter of each row based at least in part on the one or more program parameters of the plurality of rows 1604

Determining, by the one or more processors changing a programming time of each row, a set of parameters of each row that causes the first parameter not to cross the first threshold 1606

Determining, by the one or more processors, a second threshold of a second parameter of each row based at least in part on production information that includes production statistics of a plurality of dies as a result of mass production 1608

Adjusting, by the one or more processors, the programming time of each row to cause the second parameter not to cross the second threshold 1610

Programming, by the one or more processors, data to a first row of the plurality of rows using the set of parameters of the first row and the adjusted programming time of the first row 1612

SYSTEM AND METHOD FOR IMPROVED ENDURANCE IN NON-VOLATILE MEMORY SYSTEMS

TECHNICAL FIELD

The present arrangements relate generally to system and method for performing operations of a flash memory, and more particularly to system and method for determining optimal voltage thresholds (VTs) based on program parameters and/or determining optimal program parameters based on production information of a plurality of cells of a non-volatile memory.

BACKGROUND

As the number and types of computing devices continue to expand, so does the demand for memory used by such devices. Memory includes volatile memory (e.g., RAM) and non-volatile memory. One popular type of non-volatile memory is flash memory or NAND-type flash. A NAND flash memory array includes rows and columns (strings) of cells. A cell may include a transistor.

NAND flash memory program/erase (P/E) cycles may create charge traps in memory cells. This charge trap may leak over time in a temperature dependent leakage rate, resulting in an increased bit-error-rate (BER) and changes in the program states distribution, due to the retention effect. Recent 3D NAND structures can allow for either a single-shot programming, where all states are programmed at a single command (as done for example in triple-level cells (TLC) devices), or a multiple-stage programming, where the programming can be performed at multiple stages to achieve an accurate state programming with low standard-deviation (STD) of voltage thresholds of any state distribution, and achieve a low BER after programming (as done for example in higher density NAND (e.g., quadruple level cell (QLC) or penta-level cell (PLC; 5 bits per cell)). 3D NAND devices at growing density pose new challenges with QLC and even recently PLC with 4 and 5 bits per cell, respectively. This trend requires adaptation of programming and read methods with advanced signal processing in order to guarantee performance and reliability.

SUMMARY

The present arrangements relate to system and method for determining optimal voltage thresholds (VTs) based on program parameters and/or determining optimal program parameters based on production information of a plurality of cells of a non-volatile memory.

According to other aspects, arrangements provide a system including one or more processors. The one or more processors may be configured to determine one or more program parameters of each of a plurality of rows of cells of a non-volatile memory. The one or more processors may be configured to adjust the one or more program parameters of each of the plurality of rows by equalizing the one or more program parameters across the plurality of rows. The one or more processors may be configured to determine one or more programming voltages of each row based at least in part on the adjusted program parameters of the plurality of rows. The one or more processors may be configured to program a first row of the plurality of rows using the one or more programming voltages of the first row.

According to certain aspects, arrangements provide a method including determining, by one or more processors of a system, one or more program parameters of each of a plurality of rows of cells of a non-volatile memory. The method may include adjusting, by the one or more processors, the one or more program parameters of each of the plurality of rows. Adjusting the one or more program parameters may include equalizing the one or more program parameters across the plurality of rows. The method may include determining, by the one or more processors, one or more programming voltages of each row based at least in part on the adjusted program parameters of the plurality of rows. The method may include programming, by the one or more processors, a first row of the plurality of rows using the one or more programming voltages of the first row.

According to other aspects, arrangements provide a system including one or more processors. The one or more processors may be configured to determine, using first data relating to a sample set of non-volatile memory devices, one or more program parameters of a plurality of rows cells of a non-volatile memory. The one or more processors may be configured to determine, using the first data, a first threshold of a first parameter of each row based at least in part on the one or more program parameters of the plurality of rows. The one or more processors may be configured to determine, by changing a programming time of each row, a set of parameters of each row that causes the first parameter not to cross the first threshold. The one or more processors may be configured to determine a second threshold of a second parameter of each row based at least in part on production information that includes production statistics of a plurality of dies as a result of mass production. The one or more processors may be configured to adjust the programming time of each row to cause the second parameter not to cross the second threshold. The one or more processors may be configured to program data to a first row of the plurality of rows using the set of parameters of the first row and the adjusted programming time of the first row.

According to certain aspects, arrangements provide a method including determining, by one or more processors of a system, using first data relating to a sample set of non-volatile memory devices, one or more program parameters of a plurality of rows cells of a non-volatile memory. The method may include determining, by the one or more processors, using the first data, a first threshold of a first parameter of each row based at least in part on the one or more program parameters of the plurality of rows. The method may include determining, by the one or more processors changing a programming time of each row, a set of parameters of each row that causes the first parameter not to cross the first threshold. The method may include determining, by the one or more processors, a second threshold of a second parameter of each row based at least in part on production information that includes production statistics of a plurality of dies as a result of mass production. The method may include adjusting, by the one or more processors, the programming time of each row to cause the second parameter not to cross the second threshold. The method may include programming, by the one or more processors, data to a first row of the plurality of rows using the set of parameters of the first row and the adjusted programming time of the first row.

BRIEF DESCRIPTION OF THE DRAWINGS

These and other aspects and features of the present arrangements will become apparent to those ordinarily skilled in the art upon review of the following description of specific arrangements in conjunction with the accompanying figures, wherein:

FIG. 5C illustrate a table illustrating example PV level shifts as a result of PV levels optimization, according to some arrangements;

FIG. 6A and FIG. 6B illustrate a flowchart illustrating an example methodology for a PV optimization including row range definition and PV levels adaptation, according to some arrangements;

FIG. 6C illustrate a table illustrating example PV level shifts as a result of PV levels adaptation, according to some arrangements;

FIG. 7A to FIG. 7D illustrate example results of distribution of fail bit counts (FBCs) after data retention (DR) for a QLC device according to some arrangements;

FIG. 10 illustrates a flowchart illustrating an example methodology for programming for a non-volatile memory according to some arrangements;

FIG. 14 illustrates a flowchart illustrating an example methodology for optimizing programming based on mass production data for a non-volatile memory according to some arrangements;

FIG. 16 illustrates a flowchart illustrating an example methodology for optimizing write performance for a non-volatile memory according to some arrangements.

DETAILED DESCRIPTION

According to certain aspects, arrangements in the present disclosure relate to techniques for determining optimal voltage thresholds (VTs) based on program parameters and/or production information of a plurality of cells of a non-volatile memory.

1. Non-Volatile Memory Systems

NAND memory devices may tend to accumulate errors over time due to different types of stresses that may be applied to the NAND. Different techniques can be used to handle high number of errors during operations on a NAND device (e.g., operations of read or program). These techniques include optimizing voltage thresholds or re-optimizing optimal voltage thresholds.

To store information in a NAND transistor, electron charge is injected to a floating gate or an insulating layer within the transistor. Injected charge may be detected by applying voltage to a transistor control gate. If the transistor remains closed, the amount of injected charge is higher than a certain level. For example, in a triple-level cells (TLC) transistor, 3 bits are stored per cell. To implement a TLC transistor, one of 8 levels of charge is injected to distinguish between different charge options (3 bit combinations) through a threshold voltage (VT) required to open the gate. Similarly, in a quad-level cells (QLC; 4 bits per cell) or Penta-level cell (PLC; 5 bits per cell) transistor, 16 or 32 levels of charge are used per transistor to encode 4 or 5 bits. In the following, the TLC case will be used as an example but the present disclosure is not limited to TLC.

The number of electrons injected is typically limited and therefore, the accuracy of the injected charge is limited. In addition, the charge changes due to various stresses that are applied to the NAND device. As a result, when reading back the cell, the charge level, or alternatively, the minimum voltage applied to the transistor control gate to open it, may vary within a certain range for every charge level (or bit combination) that is used. Therefore, adjusting the control gate voltage levels (also called "read levels" or "read thresholds" or "threshold voltages" or "reference voltages") according to the state of the NAND, can significantly reduce the number of errors.

NAND cells are programmed and read in pages, where a page contains a collection of NAND transistors that share a control gate. A page may contain several tens of thousands of transistors or more and the transistor charge within a page can be distributed around each one of the target charge levels. The charge level per transistor may not be directly measured but can be measured through its proxy, e.g., the minimum control gate voltage required to open the transistor. The distribution of the charge within a page, as measured through its proxy, is referred to as a VT distribution.

Figure 1A:
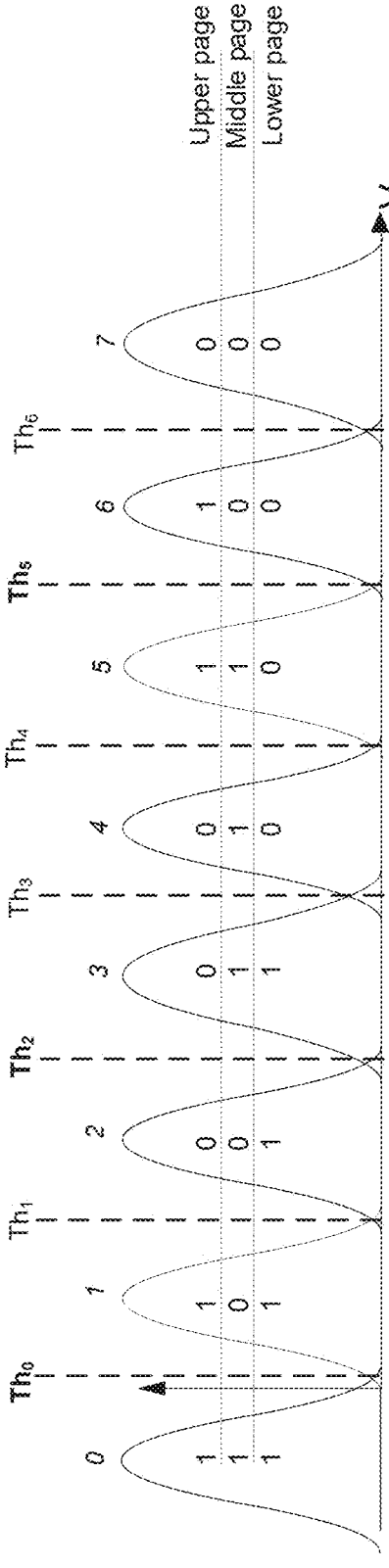
FIG. 1A illustrates threshold voltage distribution in a three bits per cell (bpc) flash device according to some arrangements.

FIG. 1A illustrates a threshold voltage distribution in a three bits per cell (bpc) flash device. FIG. 1A depicts such a VT distribution where the X-axis denotes the minimum VT level (threshold voltage) required to make the transistor open and the Y-axis denotes the number of cells corresponding to a certain threshold voltage VT. FIG. 1A also shows an example of a TLC NAND allocation of bit combination per charge level (or lobe). Various such bit allocations are possible and will typically be allocated according to gray coding with one but changing from one level to the next. In TLCS NAND, for each lobe, 3 bits are used and the bits are denoted by "lower", "middle" and "upper" pages (or page bits).

Typically, when a page is being read, a NAND device reads just one of the bits within each transistor in the page. That is, the NAND device would only read either the lower or middle or upper bits of the page. For example, in the example in FIG. 1A, to read the lower page (lower bits of the page), the device would perform a read and apply a voltage Th3 (e.g., FIG. 1A) to a shared control gate and the device would check which cells are open. All cells which are open on both reads or closed on both reads will take the logical value "1". The rest of the cells will take the logical value "0". Similarly, to read the middle page, the NAND device performs internally 3 reads with voltages Th0, Th2 and Th5, and to read the upper page, the NAND device performs internally 3 reads with voltages Th1, Th4 and Th6. The lower most lobe (0) is known as the erase level. As there may be different allocation of bits to lobes on different types of NAND devices, the choice of the thresholds to read a certain page may vary. The choice of the thresholds will also vary between TLC, QLC or other types of devices.

Figure 1B:
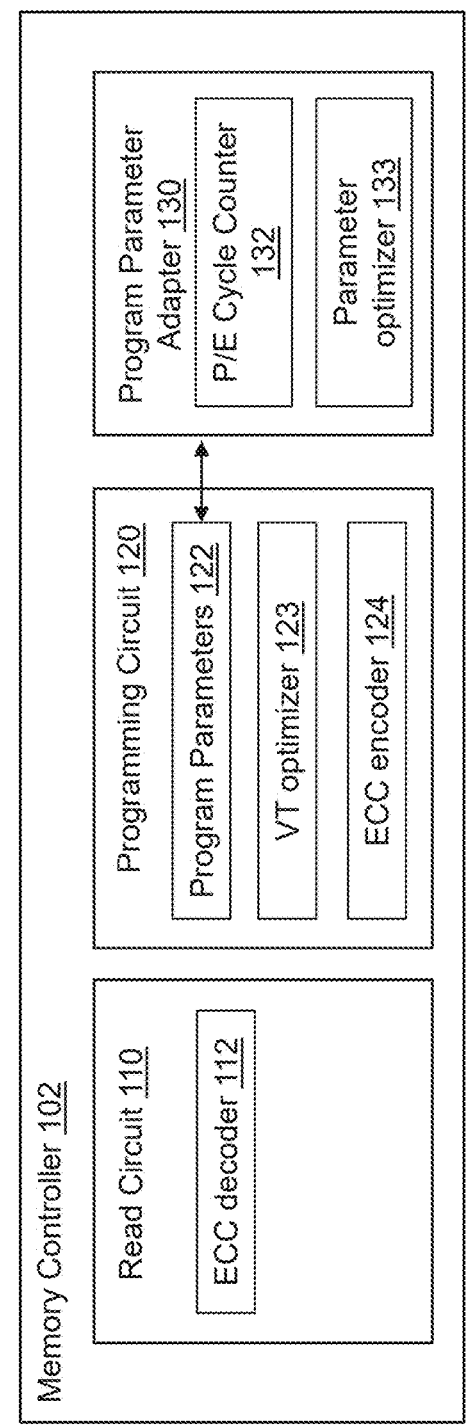
FIG. 1B illustrates example quadruple level cell (QLC) voltage thresholds (VT) distributions of a programming for two separate rows according to some arrangements.

FIG. 1B is a block diagram illustrating an example non-volatile memory system (flash memory system 100) according to some arrangements, which can perform any of the methods described in the present disclosure. The flash memory system 100 (e.g., NAND device, NAND flash device) may include a flash memory module or flash memory device 104 and a memory controller 102. The flash memory module 104 may include multiple flash memory blocks 106, each of which includes multiple flash memory rows/pages (not shown). In some arrangements, each of the multiple flash memory rows/pages may have a plurality of cells. Additionally or alternatively, the module 104 can comprise or be implemented using a plurality of dies, each of the dies containing a plurality of the blocks 106.

The memory controller 102 may include a read circuit 110, a programming circuit (e.g., a program digital signal processor (DSP)) 120 and a program parameter adapter 130. As shown in FIG. 1B, the adapter 130 can adapt the program parameters 122 used by programming circuit 120 as described above. The adapter 130 in this example may include a Program/Erase (P/E) cycle counter 132 and a parameter optimizer 133. Although shown separately for ease of illustration, some or all of the adapter 130 can be incorporated in the programming circuit 120. In some arrangements, the read circuit 110 may include an ECC decoder 112. In some arrangements, the programming circuit 120 may include and a voltage threshold (VT) optimizer 123 and an ECC encoder 124. Arrangements of memory controller 102 can include additional or fewer components such as those shown in FIG. 1B.

In some arrangements, a flash memory system (e.g., the flash memory system 100 in FIG. 1B) may include a cell flash memory (e.g., the flash memory module 104 or a flash memory block 106 in FIG. 1B) and a circuit (e.g., the read circuit 110 or the programming circuit 120 in FIG. 1B) for performing operations of the plurality of cells. In some arrangements, the flash memory module 104 may have a plurality of cells. In some arrangements, each of the flash memory blocks 106 may have a plurality of cells. In some arrangements, the VT optimizer 123 of the programming circuit 120 may be configured to determining optimal VTs based on program parameters and/or production information of a plurality of cells of a non-volatile memory. Methods of determining optimal VTs by the VT optimizer 123 according to some arrangements will be described below with reference to FIG. 2 to FIG. 16. In some arrangements, the parameter optimizer 133 of the adapter 130 may be configured to determine optimal program parameters based on production information of a plurality of cells of a non-volatile memory. Methods of determine optimal program parameters by the parameter optimizer 133 according to some arrangements will be described below with reference to FIG. 2 to FIG. 16. The read circuit 110 may be configured to perform a read operation on the first cell and decode, via the ECC decoder 112, a result of the read operation on the first cell.

In some arrangements, the cell flash memory (e.g., the flash memory module 104 or a flash memory block 106 in FIG. 1B) may include rows and columns of the plurality of cells. In some arrangements, a flash memory block 106 may include a plurality of pages (not shown) and a page may be defined as cells linked with the same word line, which correspond to a row of cells. In some arrangements, neighboring cells of a target cell are cells adjacent to the target cell. For example, each of a first neighboring cell and a second neighboring cell (of a first cell) may be positioned at the same column as a column of the first cell and at a row adjacent to a row of the first cell.

2. Programming Non-Volatile Memory with Improved Endurance

The NAND die usually has trim parameters that can be set to control read and programming circuits (e.g., read circuit 110, programming circuit 120). The amount of memory per die is limited, thereby limiting flexibility in configuration during programming or read operations. Some methods can improve reliability of data-retention by changing erase parameters for performing soft or shallow erase, which can effectively reduce the wear. However, as the erase is performed on a full block as a unit, such methods (e.g., changing erase parameters) do not allow achieving an accurate margin of erase distribution and erase depth per row. In addition, the programming process may induce a program disturb (PD) which means unintentional programming to unselected rows during the program of a target row. As a result, the rows which are programmed towards the end of the block, may usually suffer from a higher disturb (than the rows at the start of the block), which after programming may induce higher erase penetration and higher BER on voltage thresholds (e.g., first voltage threshold Th1).

To address this problem, according to certain aspects, arrangements in the present disclosure relate to techniques for improving reliability of a non-volatile memory (e.g., NAND flash memory). Arrangements in some implementations can obtain higher endurance for the same write performance on NAND flash devices by changing the program voltage levels adaptively within a NAND block using one or more processors (e.g., a program digital signal processor (DSP)).

In some implementations, a flash memory system (e.g., the flash memory system 100 in FIG. 1B) can modify a program voltage window (or "programming voltage window") of the NAND as a function of row (e.g., word line (WL)), as to minimize the wear caused during program/erase cycling. Such dynamic adaptation of a program voltage window can allow improved reliability, e.g., reduced bit error rate (BER), maximized or increased device endurance.

Figure 2:
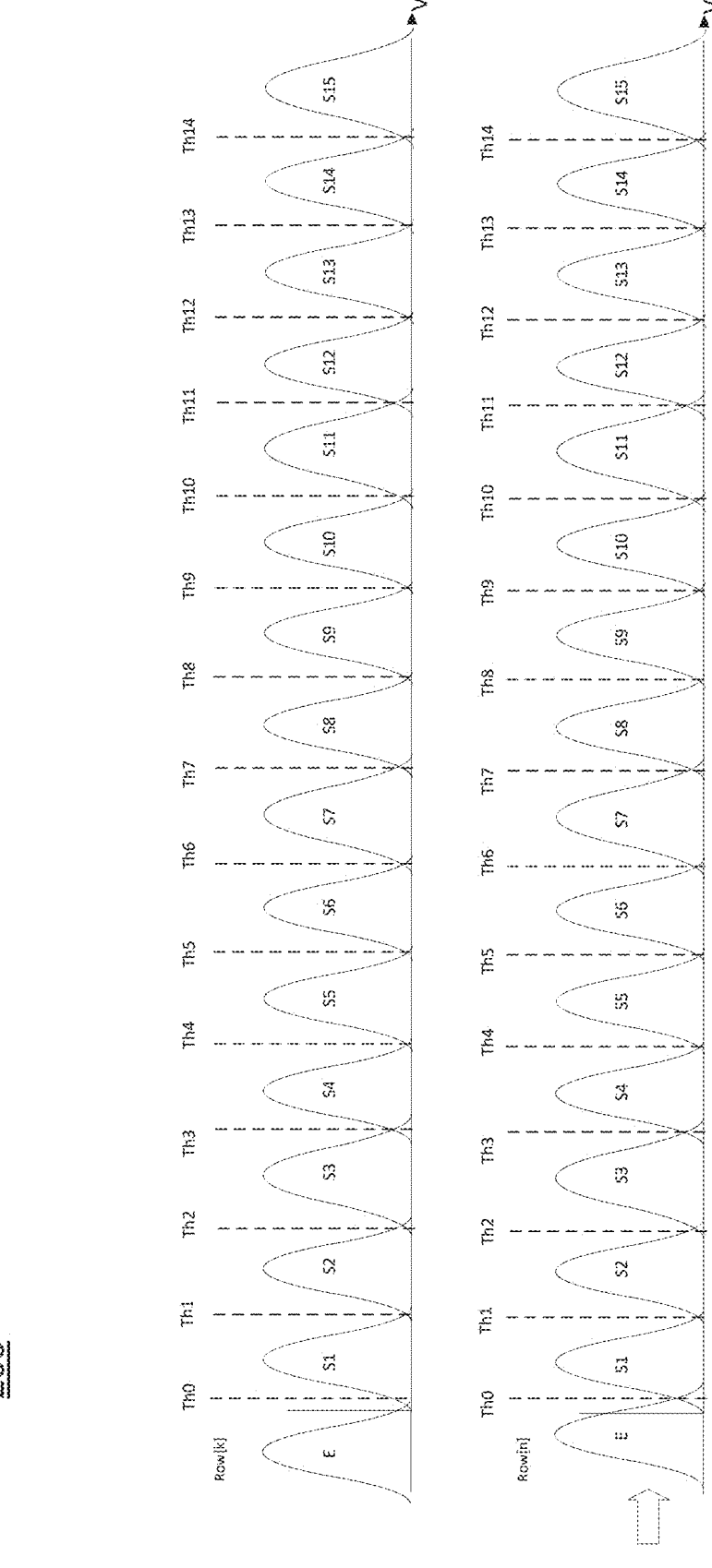
FIG. 2 illustrates is a block diagram illustrating an example flash memory system according to some arrangements.
Figure 3:
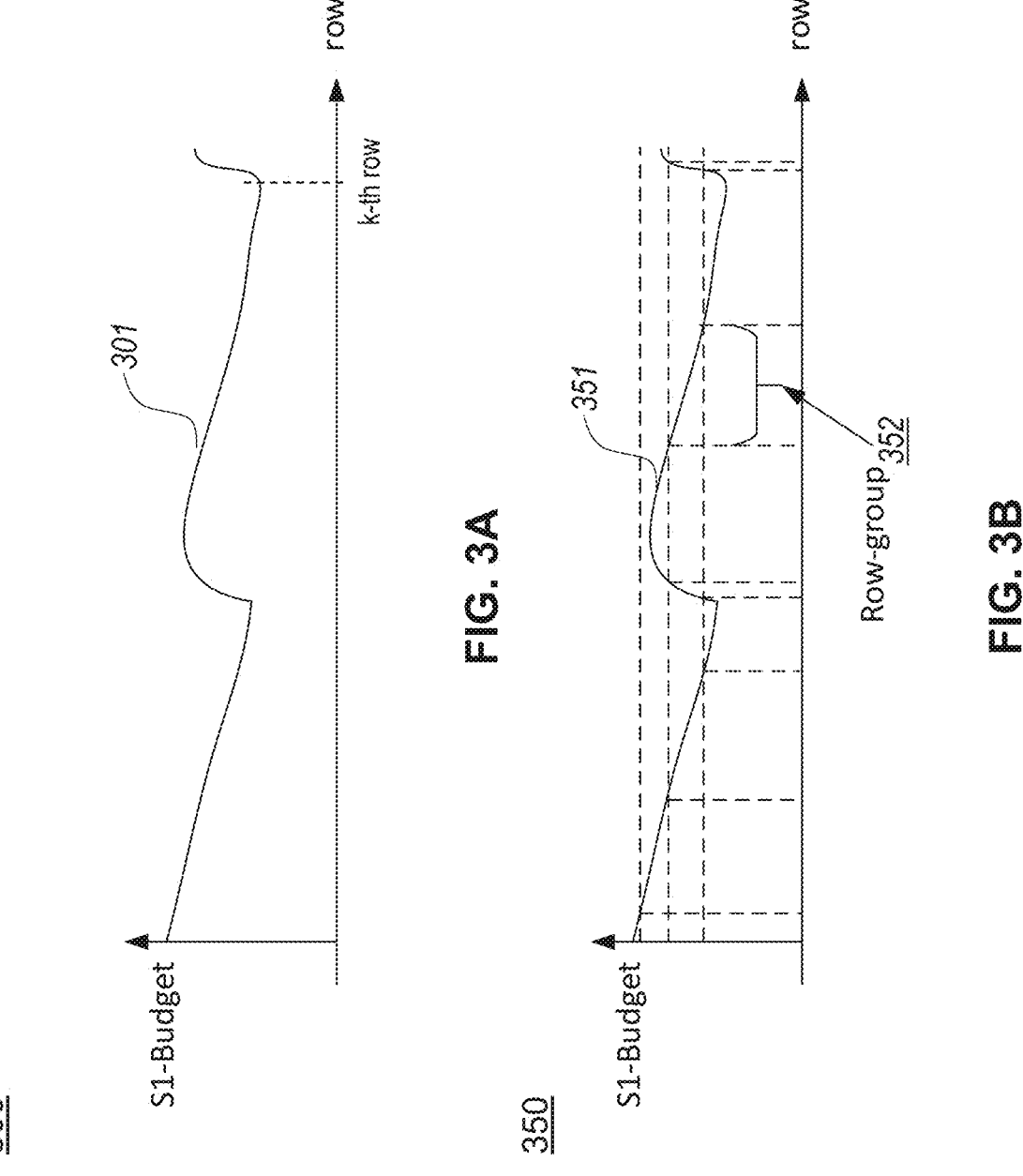
FIG. 3A and FIG. 3B illustrate example VT budget around a voltage threshold over a plurality of rows, according to some arrangements.

FIG. 2 illustrates example QLC voltage thresholds (VT) distributions of a programming for two separate rows (Row [k] and Row[n]) according to some arrangements. Each of the two rows (Row[k] and Row[n]) may have a different erase penetration. For example, on Row[k], there is almost no erase penetration, while on Row[n] there is considerable erase penetration, which results in higher BER on first threshold Th1 on Row[n] than Th1 on Row[k]. In some implementations, on Row[k] program-voltage levels of S1-S15 can be reduced to obtain a similar BER probability on Th1 on both rows. The reason for this is that usually the same error correction code (ECC) is used for all pages and rows, and the reliability is determined by the worst page BER. As long as Row[k]'s BER distribution after all stress cases is be better than (or as good as) Row[n], then the reliability may be improved by using a smaller program voltage window on row[k] and other such rows that have a larger margin on Th1.

In some implementations, a non-volatile memory system (e.g., memory controller 102) can set the programming voltages dynamically as a function of a target row such that each row has a different margin that allows a unique program voltage window. The system can adapt or optimize the program voltage window per row, such that a highest programming state (or level) is at a lowest possible level per row. For example, referring to FIG. 2, a highest programming level of Row[k] can be adapted (e.g., reduced) to be at a lowest possible level to obtain a similar BER probability on Th1 on both rows Row[k] and Row[n]. This optimization can reduce the average wear associated with every P/E cycle, which means that average BER is lower after data retention. Since the margin for program voltage window adaptation changes as a function of P/E cycles, the system can apply different programming levels per range of cycle counts (e.g., cycle counts obtained by P/E cycle counter 132).

In some implementations, the system can perform a fine-tuning optimization of a program voltage window by (1) program disturb (PD) evaluation on many devices and/or (2) selection of a first program level according to multiple hypotheses measurements. For example, the system can collect data in an initial database (e.g., data retention (DR) database) of many devices that are cycled to a given target cycle count, and perform a retention test (e.g., testing the memory's ability to maintain stored data over an extended period) and compute a VT thresholds distribution using the data in the database. From this database, it is possible to compute the BER on first threshold (Th1) per row for any hypothesis of program level shift. For example, the system can determine, based on the BER on first threshold per row, whether it is possible to perform a program level shift per row.

In some implementations, the system can optimize each program level by equalizing the page BER at data-retention (DR) end-of-life (EOL) stress. The system can perform the optimization offline on one or more database (e.g., using a DR database without actual NAND-reads from devices). In some implementations, using a VT-scan database, the system can find, for every row range (e.g., row group, row set) and/or for allowed levels, (1) the level with a minimal or lowest average (page) BER and (2) the level with a highest average (page) BER. The system can then apply a single DAC (digital-analog-converter) shift (e.g., adjusting a voltage output of a DAC by a unit step voltage) to all states (or thresholds) between the found thresholds, in the direction of the lowest average BER (e.g., shifting the voltage levels of the states in a decreasing direction), such that the level with highest BER can be improved (in terms of reliability) at the expense of the minimal page BER. A DAC shift to a read threshold in NAND refers to a voltage threshold shift for the read threshold. A "state" refers to a logical state that is programmed to a row (e.g., TLC has 8 logical states), and every cell is programmed to a specific state. A state voltage level can be shifted, since the VT-scans are offline available as a database. The effect on read thresholds from shifting the voltage threshold of all cells that belong to a specific state can be actually measured offline this way. In some implementations, the system can perform the above-described optimization algorithm in page scope and/or in all-thresholds scope.

In some cases, with extreme wear reduction, there may be higher sensitivity to read disturb (RD). For example, read disturb may occur when a read operation impacts the threshold voltages of adjacent NAND flash memory cells within the same block. In some implementations, the system can dynamically adapt or modify read-VBias or Vread to reduce the BER increase due to RD. The system can initially use a low read-Vbias (e.g., setting a read-Vbias to a low voltage value) for performing read operations. The system can then determine whether BER is increased due to the read operations. In response to determining that BER is increased due to the read operations, the system adapt the read-VBias (e.g., setting the read-VBias to its default value) in order to reduce the BER.

In some implementations, the system can improve reliability of a non-volatile memory by adapting program parameters (not only program voltage window but also other program parameters) per row range or WL range under the same programming time (e.g., same tProg, where tProg is an average page programming time). A plurality of rows of cells of a non-volatile memory (e.g., NAND flash memory) can be divided into a plurality of row ranges (e.g., row groups or row sets), each row range (e.g., each row group or row set) containing one or more rows. In some implementations, the system can improve reliability and write performance of a non-volatile memory by adapting program parameters (not only program voltage window but also other program parameters) per row range or WL range to lower or reduce the programming time (e.g., tProg).

In some implementations, the system can perform programming with program parameters that configure NAND die from a controller (e.g., memory controller 102 or program parameter adapter 130) by setting the program parameters as a function of row range and/or cycle range. For example, the controller can have larger memory compared to NAND die and hold common parameters for multiple dies that are usually connected to the same controller, and can set different parameters as a function of row number and/or cycle count. By setting different parameters as a function of row number and/or cycle count, the system can perform a new set of optimizations that can improve (1) reliability of a NAND flash device by programming at variable program voltage window sizes or with program voltage levels adapted per row range (e.g., per WL range); and/or (2) write performance of a NAND flash device by tProg acceleration on rows (e.g., WLs) with lowest fail bit count (FBC) distribution.

In some implementations, the system can optimize or adapt program voltage levels to minimize wear and improve reliability by computing an available VT budget. The VT budget around a given (i-th) read threshold $TH_i$ is given or defined by:

$$VTbudget(TH_i) = \qquad\qquad\qquad\qquad \text{(Equation 1)}$$

$$V_{avg}(S_i) - p \cdot \sigma(S_i) - (V_{avg}(S_{i-1}) + p \cdot \sigma(S_{i-1})),$$

where $V_{avg}(S_i)$ is an average of voltage threshold distribution for i-th state (or i-th threshold), $\sigma(S_i)$ is the standard deviation of voltage threshold distribution for i-th state, and p is a constant scalar, for example p=2.5. The VT budget around different read thresholds can have different values per row or even per WL in a 3D NAND memory.

In some implementations, the system can optimize or adapt program voltage levels for wear minimization and improved reliability by computing a valid program voltage shift after data retention on each row for some reference cycle count. For example, the system can collect data in an initial database of many non-volatile devices that are cycled to a given target cycle count, perform a retention test with the database, and compute VT thresholds distribution. From the database (e.g., DR database or VT-scan database), the system can compute the BER on first threshold (e.g., Th1) per row for any hypothesis of a program level shift. If program voltage levels of all states (e.g., S1 to S15 in QLC in FIG. 2) are shifted by a −1 DAC step (e.g., shifted by a unit step voltage in a negative direction), the BER on Th1 (first threshold) may increase since the overlap with the erase state "E" (e.g., "E" state in FIG. 2) is increased. The BER increase can be measured offline on the database (e.g., DR database or VT-scan database). That is, the BER increase can be measured or obtained without having to program the NAND device, but simply by applying the shift on the cells that are programmed to S1-S15 in the database. If the BER increase is below a reliability threshold, the system can consider a larger step (e.g., −4 DAC), perform optimization using such a larger step for each row or WL separately, or for a set of rows (e.g., row range, row group) that can be defined among the plurality of rows of cells of the NAND device.

In some implementations, a system may include one or more processors. The one or more processors may be configured to determine, using first data relating to a sample set of non-volatile memory devices, one or more program parameters of each of a plurality of rows of cells of a non-volatile memory. The one or more processors may be configured to adjust, using the first data, the one or more program parameters of each of the plurality of rows by equalizing the one or more program parameters across the plurality of rows. The one or more processors may be configured to determine one or more programming voltages of each row based at least in part on the adjusted program parameters of the plurality of rows. The one or more processors may be configured to program a first row of the plurality of rows using the one or more programming voltages of the first row.

In some implementations, each of the plurality of rows may correspond to a word line. In some implementations, the one or more program parameters may include at least one of a program voltage window, a voltage threshold (VT) budget, a bit error rate (BER) per page (page BER), a BER per threshold, or a fail bit count (FBC).

In some implementations, the one or more processors may be configured to collect data relating to voltage thresholds of the plurality of rows. The one or more processors may be configured to perform, based at least in part on the collected data, adjusting the one or more program parameters of each row and determining one or more programming voltages of each row.

In some implementations, in adjusting the one or more program parameters of each row, the one or more processors may be configured to adjust the one or more program parameters of each row to cause a value of the one or more program parameters of each row to be equal to a minimum value of the one or more program parameters of the plurality of rows.

In some implementations, the plurality of rows may be divided into a plurality of row groups, at least one of the plurality of row groups including two or more rows. In adjusting the one or more program parameters of each row, the one or more processors may be configured to determine one or more program parameters of a first row group, and adjust the one or more program parameters of the first row group.

In some implementations, the one or more processors may be configured to adjust the one or more program parameters of the first row group to cause a minimum value of the one or more program parameters of the row group to be equal to a minimum value of the one or more program parameters of the plurality of rows. The one or more processors may be configured to determine the one or more programming voltages of each row by determining the one or more programming voltages of the first row group based at least in part on the adjusted program parameters of the first row group.

In some implementations, the one or more processors may be configured to determine a minimum value of program parameters for a plurality of pages of the first row group. The one or more processors may be configured to determine a maximum value of the program parameters for the plurality of pages of the first row group. The one or more processors may be configured to determine whether a ratio of the maximum value to the minimum value is greater than a threshold. In response to determining that the ratio of the maximum value to the minimum value is greater than the threshold, the one or more processors may be configured to determine the one or more programming voltages of the first row group. In response to determining that the ratio of the maximum value to the minimum value is smaller than or equal to the threshold, the one or more processors may be configured to determine one or more program parameters of a second row group and adjusting the one or more program parameters of the second row group.

In some implementations, the one or more processors may be configured to determine program parameters for a plurality of threshold voltages in the first row group. The one or more processors may be configured to determine the one or more programming voltages of each row by determining a first threshold voltage with a lowest value of the program parameters in the first row group, determining a second threshold voltage with a highest value of the program parameters in the first row group, and shifting one or more programming voltages between the first threshold voltage and the second threshold voltage in an identical direction which is either a positive direction or a negative direction.

In some implementations, the one or more processors may be configured to determine a first voltage level of the first threshold voltage among the plurality of threshold voltages. The one or more processors may be configured to determine a second voltage level of the second threshold voltage among the plurality of threshold voltages. The one or more processors may be configured to determine the identical direction based at least in part on the first voltage level and the second voltage level.

Arrangements in the present disclosure have at least the following advantages and benefits. Arrangements in the present disclosure can provide useful techniques for allowing higher read performance and extended reliability under all stress conditions. For example, by setting different parameters as a function of row number and/or cycle count, arrangements in the present disclosure can perform a new set of optimizations that can improve (1) reliability of a NAND flash device by programming at variable program voltage window sizes or with program voltage levels adapted per row range (e.g., per WL range); and/or (2) write performance of a NAND flash device by tProg acceleration on rows (e.g., WLs) with lowest FBC distribution.

FIG. 3A and FIG. 3B illustrate example VT budgets around a voltage threshold over a plurality of rows, according to some arrangements. FIG. 3A shows a graph 300 of exemplary VT budget S1-Budget or VTbudget(Th$_1$) which is computed for each row and/or averaged on multiple devices. For example, the VT budget VTbudget(TH$_1$) represented by a line 301 can be computed per row, for a given stress condition, e.g., program disturb (PD), and averaged on multiple blocks and/or multiple devices. As shown in FIG. 3A, on rows at the beginning of the block, and after the middle of the block, there is high VTbudget(TH$_1$). On these rows, in some implementations, a non-volatile memory system can shift the programming voltage (PV) levels down to lower PV levels, which in turn provides wear reduction. The system can compute the amount of shift for PV levels reduction per row, for example, according to the worst row, which has the lowest VTbudget(TH$_1$). For example, in FIG. 3A, k$^{th}$ row has the lowest VTbudget(TH$_1$). In all other rows, PV levels may be shifted, for example, by the voltage difference:

$$VTbudget(Th_1, n) - \min_{all\,rows} (VTbudget(Th_1)), \qquad \text{(Equation 2)}$$

$$\text{such that for example } VTbudgetNew(Th_1, n) =$$

$$VTbudget(Th_1, n) - \left( VTbudget(Th_1, n) - \min_{all\,rows} (VTbudget(Th_1)) \right) =$$

$$\min_{all\,rows} (VTbudget(Th_1))$$

where VTbudget(Th$_1$, n) is a VT budget of n$^{th}$ row around the first voltage threshold Th$_1$. Equation (2) indicates that the system can compute the amount of shift for PV levels reduction per row such that the VT budget for each row around the first voltage threshold is equal to the lowest VTbudget(TH$_1$).

FIG. 3B shows a graph 350 of exemplary VT budget S1-Budget or VTbudget(Th$_1$) which is computed for each row and/or averaged on multiple devices, with definition of row groups (e.g., row ranges, row sets), where the same program optimization (e.g., same amount of shift for PV levels reduction per row) is performed to all rows in the group. For example, the VT budget VTbudget(TH$_1$) represented by a line 351 can be computed per row group (e.g., per row range, per row set), for a given stress condition, e.g., program disturb (PD), and averaged on multiple blocks and/or multiple devices. In some implementations, a non-volatile memory system can group multiple neighboring rows and perform or apply the same PV level shifts on all rows in same group, in order to reduce memory requirements. In some implementations, the system can define a finite number of groups for neighboring rows with similar VTbudget(TH$_1$). For example, FIG. 3B shows that similar VTbudget intervals are separated by horizontal dashed lines and different row groups (e.g., row group 352) are separated by dashed vertical lines. In some implementations, the system can compute a shift of PV levels for all rows in a group (referred to as "group rows") by $$\min_{group\,rows} (VTbudget(Th_1)) - \min_{all\,rows} (VTbudget(Th_1)).$$

Figure 4:
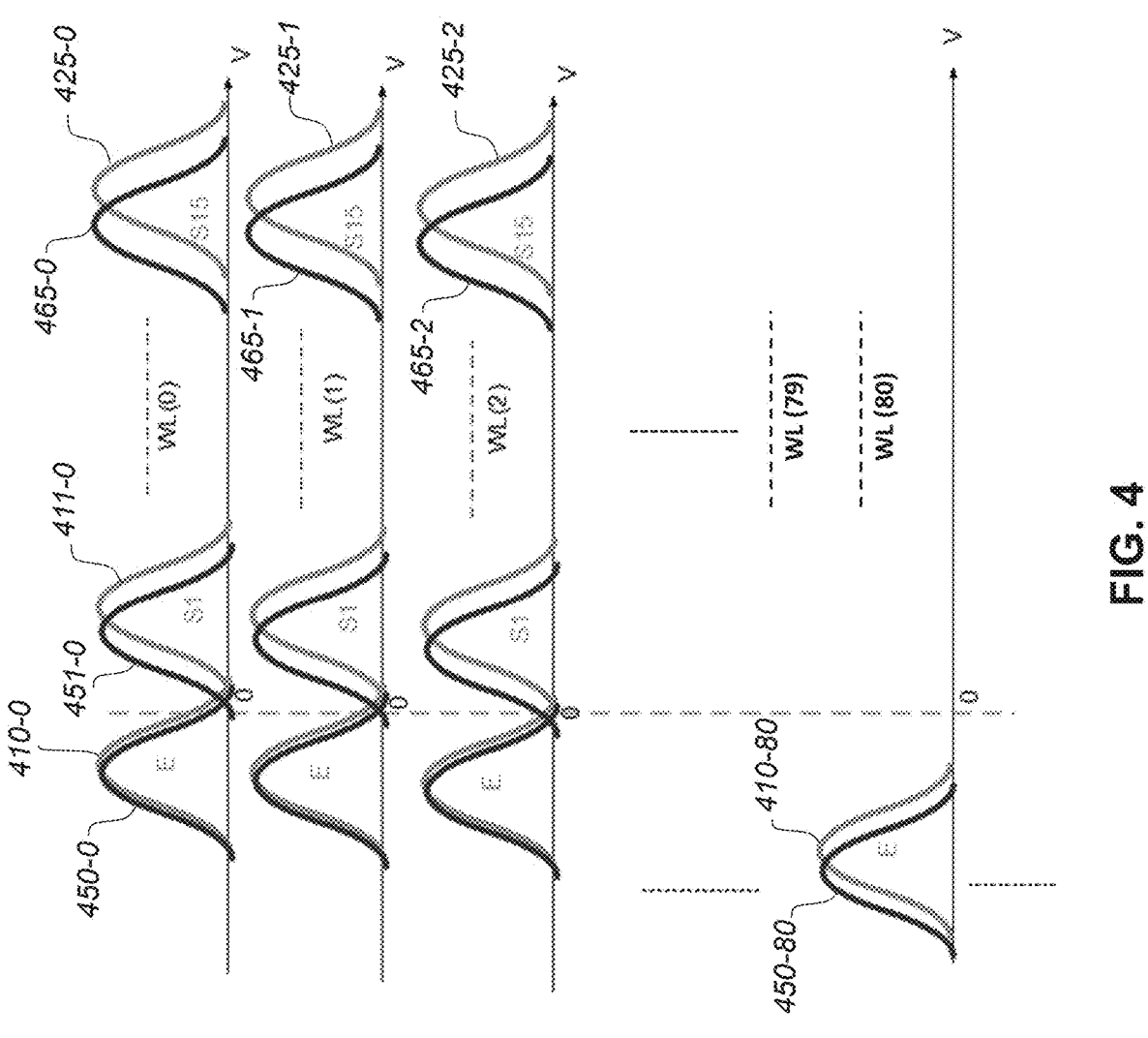
FIG. 4 illustrates an example method of programming for a plurality of rows, according to some arrangements.

FIG. 4 illustrates an example method 400 of programming for a plurality of rows, according to some arrangements.

FIG. 4 shows an exemplary optimized programming VT distribution (e.g., E (450-0), S1 (451-0), . . . , S15 (465-0) at WL(0)) versus a default programming VT distribution (e.g., E (410-0), S1 (411-0), . . . , S15 (425-0) at WL(0)). In some implementations, a non-volatile memory system (e.g., memory controller 102, VT optimizer 123) can perform digital signal processing (DSP) to obtain an optimized programming VT distribution by adjusting (e.g., reducing) default programming levels (which follows a default programming VT distribution). Such optimized programming VT distribution can have advantage in reducing the program disturb.

For example, referring to FIG. 4, the system can reduce the program disturb to neighboring rows (e.g., row WL(80)) by using lower S15 programming levels (e.g., S15 (465-0)) on earlier programmed rows (e.g., row WL(0)) that may induce interference to a target row (e.g., row WL(80)). FIG. 4 demonstrates conditions just before programming for row of WL(80), where previous rows that are dependent (e.g., WL(0), WL(1), . . . , WL(79)) can be programmed according to some implementations by reduced S15 levels (e.g., S15 (465-0) reduced from S15 (425-0) at WL(0), S15 (465-1) reduced from S15 (425-1) at WL(1), S15 (465-2) reduced from S15 (425-2) at WL(2)) and other levels per row or per row ranges. FIG. 4 shows that just before programming WL(80) the effect of program disturb (PD) on WL(80) can be smaller with the optimized VT programming levels compared to default (legacy) programming levels such that the erase distribution (e.g., E (450-80)) of optimized WL(80) may be deeper and may also have a smaller VT-STD (standard deviation) than the erase distribution (e.g., E (410-80)) of default (legacy) WL(80). As a result, when programming WL(80), the system can perform a more accurate programming with a lower BER, which contributes to improved reliability, without any impact on programming performance.

Figure 5A:
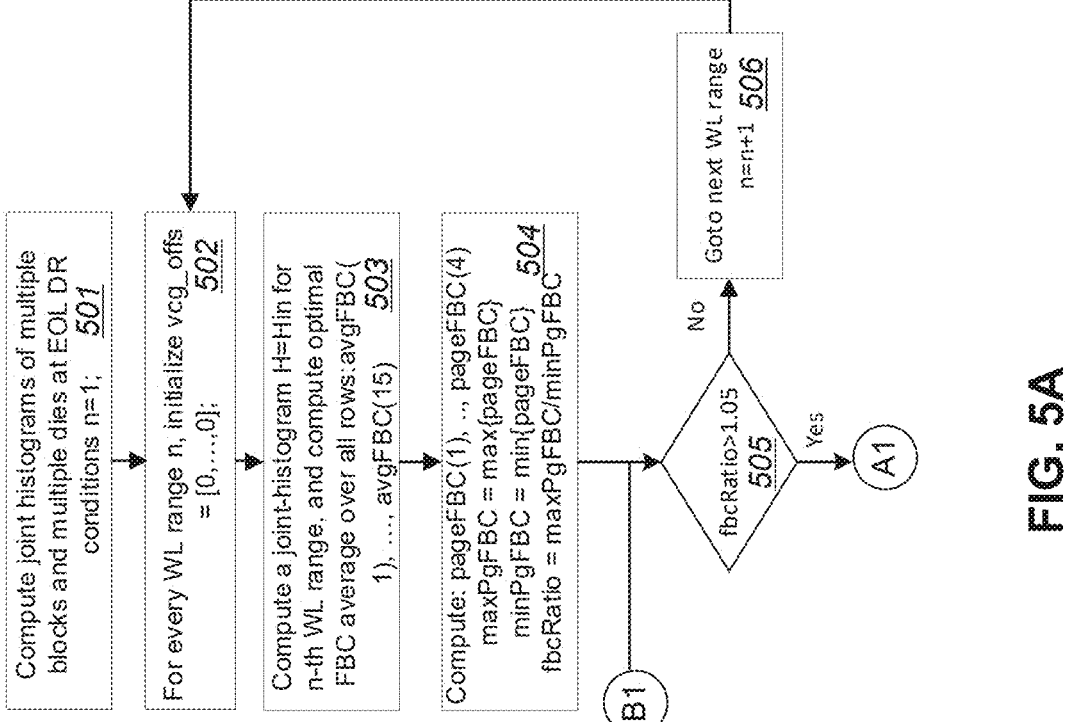
FIG. 5A and FIG. 5B illustrate a flowchart illustrating an example methodology for programming voltage (PV) optimization for end-of-life (EOL) stress conditions, according to some arrangements.
Figure 5B:
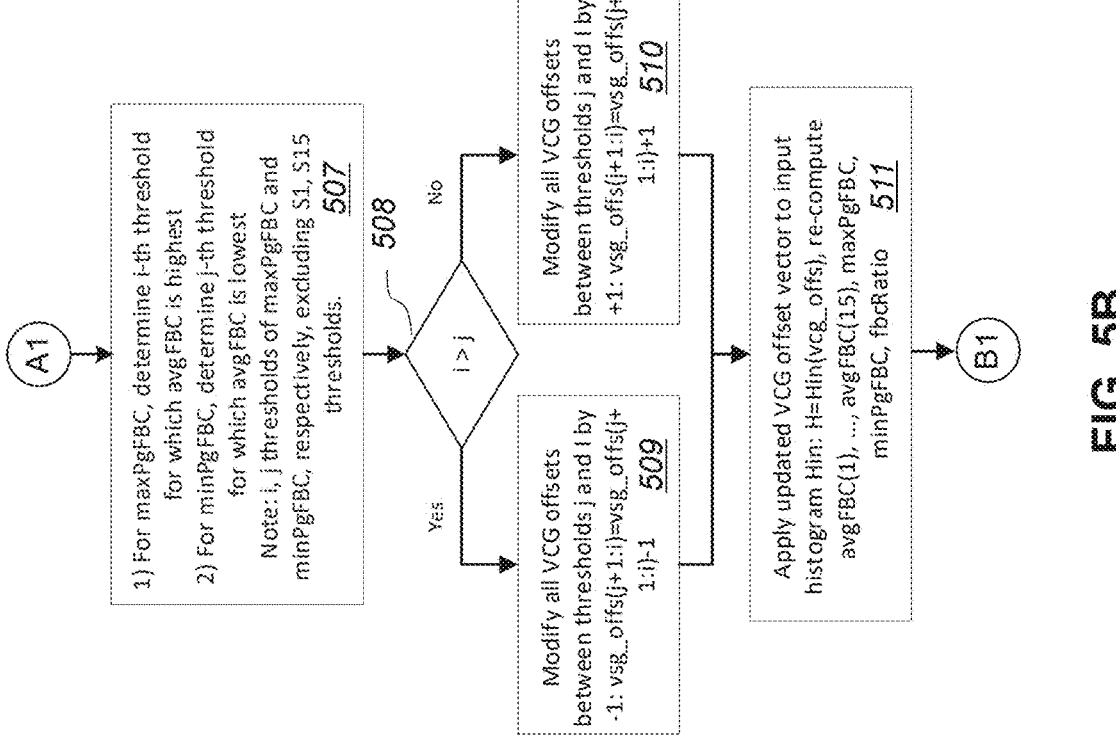

FIG. 5A and FIG. 5B illustrate a flowchart illustrating an example methodology for programming voltage (PV) optimization for end-of-life (EOL) stress conditions, applied for every row range (e.g., row group, row set), according to some arrangements. In some implementations, a non-volatile memory system can perform a step of PVs calibration to optimize automatically the PV level of every state, for every row range or WL range. During the optimization, the system may calibrate PVs due to the following reasons: (1) parameter modifications (e.g., changes, adjustment, adaptation) during the optimization may induce some distribution change of some states; and/or (2) changes of program voltage windows per WL range may benefit from additional PV optimization. In some implementations, the system can perform a PV levels optimization to achieve balanced page BER at (EOL) stress, such as data retention (DR) stress. For example, the system may initialize PV shifts per WL range, such that VT budget is equalized across all WLs.

Referring to FIG. 5A and FIG. 5B, a PV optimization method or process 500 begins in 501 by computing, by a non-volatile memory system, joint histograms of multiple blocks and multiple dies at ELO DR conditions. A row (WL) range index n may be initialized to 1 (indicating the 1$^{st}$ row range). In some implementations, the system may cycle several devices to EOL (e.g., 3K P/E cycles) and test with DR (e.g., 1 Y@40 C-1 year at 40 degrees Celsius) and generate (e.g., create, build) a VT distribution database based on results of the test.

In some implementations, for every WL range, the system may compute PV fixes (e.g., PV offsets, PV shifts, PV adjustments) iteratively in 502 through step. In step, in some arrangements, for every WL range n, the system can initialize a VCG offset vector (vcg_offs) to [0, . . . , 0] indicating PV offsets or shifts to corresponding voltage thresholds (e.g., S1 to S15). VCG is a voltage applied to control gate. VCG is related to target programming voltage threshold levels. In some implementations, the PV optimization may PV optimization may exclude S1 (erase state margin) and S15 (highest state).

In 503, in some arrangements, the system can compute a joint histogram H=Hin for $n^{th}$ WL range, and compute (from one or more DR VT-scans databases) average page BER with optimal thresholds over all rows in the $n^{th}$ WL range, for example, avgFBC(1), avgFBC(2), . . . , avgFBC(15).

In 504, in some arrangements, the system can compute average page FBC (per page; for example, 4 pages in QLC) over all rows in the $n^{th}$ WL range: pageFBC(1), pageFBC(2), pageFBC(3), and pageFBC(4), compute (1) a maximum page FBC (maxPgFBC)=$\max_{1 \le i \le 4}$\{pageFBC(i)\}, (2) a minimum page FBC (minPgFBC)=$\min_{1 \le i \le 4}$\{pageFBC(i)\}, and (3) a ratio (fbcRatio)=maxPgFBC/minPgFBC.

In 505, in some arrangements, the system can determine whether the ratio (fbcRatio) is greater than a threshold (e.g., 1.05). In 506, in some arrangements, in response to determining that the ratio (fbcRatio) is smaller than or equal to the threshold, the system can go to processing of a next WL range in 502 by increasing the range index n.

While the ratio is greater than the threshold, the system may iteratively perform 507 through step 511. In 507, in some arrangements, in response to determining that the ratio (fbcRatio) is greater than the threshold, the system can (1) determine, for the page with the maximum page FBC, $i^{th}$ threshold for which the average FBC is highest to add a unit step voltage (e.g., 1DAC) for this threshold; and (2) determine, for the page with the minimum page FBC, $j^{th}$ threshold for which the average FBC is lowest to subtract a unit step voltage (e.g., 1DAC) for this threshold. It is noted that $i^{th}$ threshold and $j^{th}$ threshold exclude thresholds for S1 and S15 (e.g., 1<i<15, 1<j<15).

In 508, in some arrangements, the system can determine whether i is greater than j (e.g., whether $i^{th}$ threshold is on the right side of $j^{th}$ threshold). In 509, in some arrangements, in response to determining that i is greater than j, the system can modify all VCG offsets between thresholds j and i by −1 as follows (repeating Equation (3) by incrementing j by 1 until j=i−1):

$$vsg\_offs(j + 1: i) = vsg\_offs(j + 1: i) - 1. \qquad \text{(Equation 3)}$$

In 510, in some arrangements, in response to determining that i is smaller than or equal to j (i≤j), the system can modify all VCG offsets between thresholds i and j (i≤j) by +1 as follows (repeating Equation (4) by incrementing i by 1 until i=j−1):

$$vsg\_offs(i + 1: j) = vsg\_offs(i + 1: j) + 1. \qquad \text{(Equation 4)}$$

In 511, in some arrangements, the system can (1) apply updated VCG offset vector vsg_offs to input histogram Hin such that H=Hin(vcg_offs); (2) re-compute optimal BER per threshold and per page, e.g., avgFBC(1), avgFBC(2), . . . , avgFBC(15); (3) re-compute maxPgFBC, minPgFBC, fbcRatio; and (4) go to step 505. For example, the system can apply the updated VCG offset vector vsg_offs (e.g., VCG offsets determined in steps 509 and 510) to perform an offsets fix to the existing DR VT-scans (e.g., VT distribution database). The VT optimization shown in FIG. 5A and FIG. 5B can provide BER improvement and increased robustness for EOL DR.

In some implementations, the PV optimization illustrated in FIG. 5A and FIG. 5B can be extended to support optimization of the edge state levels (e.g., S1 and S15 in QLC). The system can shift S1 PV down to a lower PV (e.g., to the left) for WL ranges that have sufficiently low BER on Th1 at end-of-life (EOL) DR conditions (e.g., WL ranges having BER less than a first BER threshold); otherwise the system can shift S1 PV up to a higher PV (e.g., to the right) for WL ranges that have sufficiently high BER on Th1 at EOL DR conditions (e.g., WL ranges having BER greater than a second BER threshold that is greater than the first BER threshold). When the PV on Th1 is shifted, the PV level of S15 and all other states can be shifted by the same step as a preparation step for applying the PV optimization flow of FIG. 5A and FIG. 5B.

In some implementations, the optimized PV offsets can be described or defined as a set of PV shifts, which are relative to device default values of PV levels. It is noted that the default value of the PV levels for each state can be different per device, and even per plane, as these may be trim parameters, which are trimmed in production. For example, a flash NAND memory system supporting 4 planes can allow for simultaneously programming groups of 4 blocks where each block belongs to a different plane. Also read commands can be performed on 4 blocks that are on different planes. On a 4-plane device, every 25% of the blocks belong to a different plane (e.g., each plane has its own circuitry for program/read) thereby achieving higher performance on program/read.

In some implementations, the optimized shifts or offsets per WL range may be the same for all devices. In this case, a table in the controller (e.g., a table in memory of memory controller 102) can store the optimized shifts or offsets per WL range, and the controller can apply the shifts or offsets per device and/or per plane during programming. FIG. 5C illustrate a table 550 (Table 1) illustrating example PV level shifts as a result of PV optimization, according to some arrangements.

Referring to FIG. 5C, Table 1 shows an exemplary PV level shifts per row range (e.g., row range 0-2, row range 3-40, . . . , row range 1100-1104), for each PV level (e.g., PV S1V, PV S2V, . . . , PV S15V) on a QLC device. In Table 1, every table entry specifies the shift in DAC units for a PV level, for a given row range. In some implementations, a non-volatile memory system can apply the same shift to all PV values on all planes and all devices, even if their corresponding default PV values are not the same. That is, the default value of PV per state per device and per plane may have different values which are trimmed to overcome programming circuit impairments. The system can operate in a similar way on all devices after trimming, and therefore can apply a common shift per PV state and per WL range for all planes and all dies.

Figure 6A:
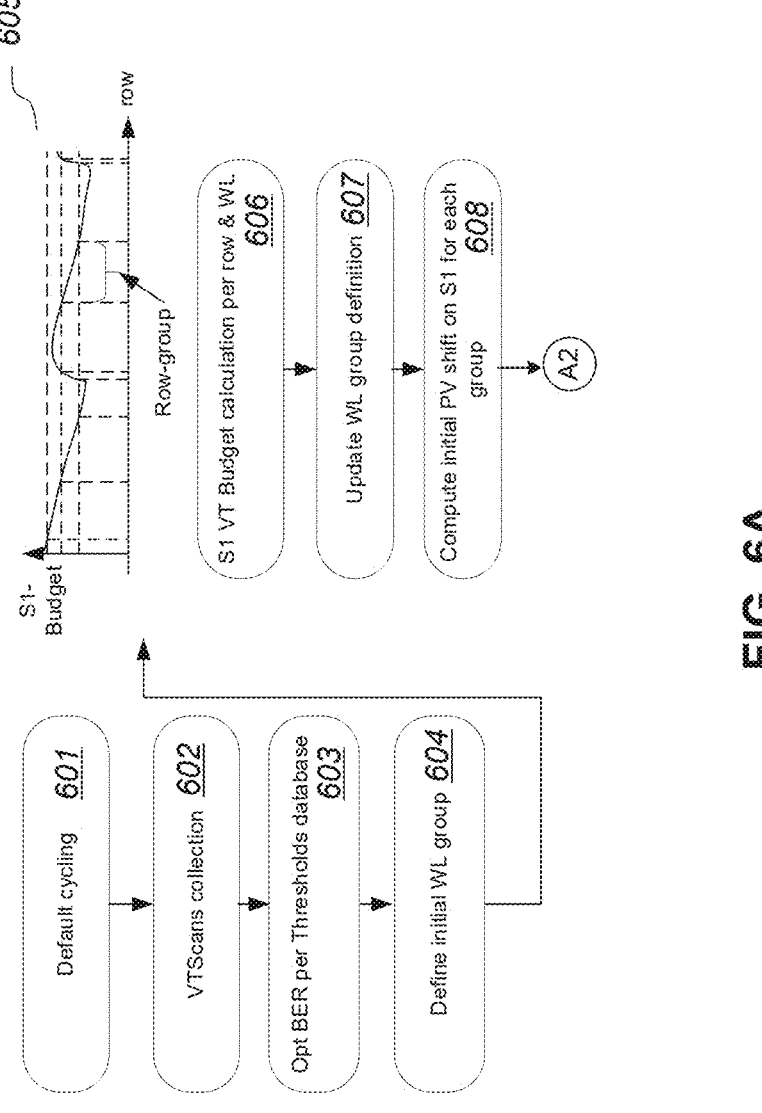

FIG. 6A and FIG. 6B illustrate a flowchart illustrating an example methodology for an initial PV optimization including row range definition and PV levels adaptation, according to some arrangements. Referring to FIG. 6A and FIG. 6B, an initial PV optimization method or process 600 begins in step 601 by performing, by a non-volatile memory system, a default cycling. In some implementations, in step 601, cycled devices can be prepared according to a target specification.

In step 602, in some arrangements, the system can perform a VT-scans collection and/or create a VT distributions database. In step 603, in some arrangements, the system can optimize a BER per thresholds database. For example, the system can compute optimal BER with optimal thresholds. In some implementations, from the optimal thresholds and BER computed in step 603, and from VT budget per threshold, the system can compute an initial S1-budget which is used to determine the WL groups or row groups, according to S1-budget similarity between neighbouring rows or WLs.

In step 604, in some arrangements, the system can define an initial WL group (e.g., row group, row range, row set, WL range). In step 606, in some arrangements, the system can calculate S1 VT budget per row (or WL). In step 607, in some arrangements, the system can update the definition of WL group. In step 604 through step 607, the system can determine WL groups based on S1-budget similarity between neighbouring rows or WLs. In some implementations, the WL groups may account for NAND parameters which are different between rows, and such rows may be on separate WL groups.

In step 608, in some arrangements, the system can compute an initial PV shift on S1 for each WL group. In some implementations, the system can compute the initial PV shift from the S1-budget and an initial database (e.g., database created in 602).

In step 610, in some arrangements, the system can create a search grid around S1 VT budget per WL group as follows:

$$PV1Grid = S1Budget + [-10{:}\ 1{:}\ 10];\text{ and} \qquad \text{(Equation 5)}$$

$$PV[2-15] = PV[2-15] + PV1 + 2. \qquad \text{(Equation 6)}$$

PV1 is a value from PV1grid. All values are evaluated by performing program/read.

In step 611, in some arrangements, the system can evaluate on many DUTs (devices under test) for all PV1Grid values. The evaluation includes program/read from multiple blocks on these devices, and measuring the BER on the 1$^{st}$ threshold. The main goal is to characterize the BER change for every WL group due to the programming voltage shift defined by PV1 and PV2-PV15 for every value in the grid.

In step 612, in some arrangements, the system can update PV levels as follows:

$$PV1 = PV1Grid[sel];\text{ and} \qquad \text{(Equation 7)}$$

$$PV[2-15] = PV1 + 2. \qquad \text{(Equation 8)}$$

This step specifies the voltage levels for programming for every selected grid value of first threshold In 613, in some arrangements, the system can perform a delayed read with (near) optimal thresholds to evaluate with online data retention (DR). That is, after programming with reference data and with specified shifts as in Equations (7) and (8). The BER is measured by reading from NAND, either immediately, or with some delay as to take into account the effect of some data-retention on the BER.

In step 614, in some arrangements, the system can evaluate results of optimal BER measured on S1 for each grid value on all devices. This step includes analysis of all measurements of BER for all devices and all shifts in the PV1grid. From this analysis the PV1 shift that is selected is that with lowest PV1 that has acceptable BER increase on first threshold.

In step 615, in some arrangements, the system can select PV1 as the lowest PV value such that BER implication is within allowed range. In some implementations, the system may find the WL group with minimal average VT budget for 1$^{st}$ read threshold ("minimal VT budget"). For all other WL groups, the system may calculate the (negative) difference of 1$^{st}$ read threshold VT budget from minimal VT budget as "VT budget margin" of that WL group. For example, if the 1$^{st}$ read threshold VT budget of WL group 2 is 60 DAC and the minimal VT budget is 20 DAC, the system may calculate the VT budget margin of WL group 2 as difference of the 1$^{st}$ read threshold VT budget from the minimal VT budget (e.g., 20 DAC–60 DAC=(–40) DAC). The system may calculate the difference between the minimal VT budget and a maximal 15$^{th}$ read threshold VT budget ("VT budget slack"). For each WL group, the system may set "minimal S1 PV shift" to (VT budget margin)–(VT budget slack/2). For example, if the VT budget margin of WL group 9 is (–40) DAC and VT budget slack is 20 DAC, the system may calculate the minimal S1 PV shift of WL group 9 as (VT budget margin)–(VT budget slack/2)=–40 DAC–20 DAC/2=(–50) DAC.

In step 616, in some arrangements, the system can set PV2-PV15 relative to PV1 and modify PV[n] such that all pages have equal BER at EOL DR stress. In 616, the system may perform the following: In 616-1, for each WL group, the system set basic PV shifts to ~80% of VT budget margin (e.g., VT budget margin calculated in 615). For example, if the VT budget margin of WL group 4 is –40 DAC, the system may calculate the basic PV shift of WL group 4 as –32 DAC (=0.8×(–40) DAC). In 616-2, the system may the basic PV shifts, to satisfy the following constraint (referred to as "S15 constraint") that a maximal highest PV shift difference between neighboring WL groups (on S15 in QLC) should not exceed some limit or a threshold (e.g., 40 DAC). For example, after WL groups 1-7 are optimized, if the basic PV shift of WL group 2 is –45, and the basic PV shift of WL group 3 is –2, the system may determine that the maximal highest PV shift difference between WL group 2 and WL group 3 exceeds the threshold of 40 DAC, and set the fixed basic PV shift of WL group 3 to –5 to satisfy the S15 constraint. In 616-3, the system may set initial PV shifts for all thresholds (per WL group) to the value of (fixed) basic PV shifts. For example, if the fixed basic shift of WL group 3 is –35 DAC, initial PV shifts of WL group 3 may be set such that PV_S1V=PV_S2V= . . . =PV_S15V=–35.

In step 617, in some arrangements, the system can evaluate endurance improvement. Generally, evaluation of endurance improvement can be performed by performing cycling of blocks on some devices with the selected program DSP parameters (e.g., program parameters). Then program on last cycle with reference data, apply additional stress such as retention, and measure the optimal threshold read BER. The comparison of this BER to the case of default programming and exactly same stress testing can reveal the endurance improvement with the program DSP parameters.

In some implementations, in performing steps 610 to 616, the system can perform the following operations (1)-(7) (or subset). In operation (1), the system may program all cycled blocks with initial PV shifts from previous phase (e.g., initial PV shifts determined in 616-3).

In operation (2), the system may perform "mini optimization" of read threshold per WL group. In some implementations, initial read thresholds may be identical to PV offsets. For example, if the PV offset PV_S2V is –28 DAC, the initial read threshold on Th2 may be set to −28 DAC. The system may read all blocks with read thresholds in the range of −5 DAC to +5 DAC around the initial read thresholds, and calculate average BER per threshold. The system may then select best read thresholds per WL group (that have minimal BER per threshold).

In operation (3), the system may read all blocks with "best read thresholds" (e.g., best read thresholds selected in operation (2)). For each WL group, the system may calculate average BER per threshold. In operation (4), the system may compare the calculated BER (e.g., average BER per threshold calculated in operation (3)) to default programming BER. In some implementations, for each WL group, if the calculated BER on Th1 is less than 50% higher than default BER on Th1 and the calculated BER on Th2 to Th15 is not larger than default BER on Th2 to Th15, then the system may determine that the optimization goal is achieved for current WL group. Otherwise, the system may shift all PVs to the left (iteratively), up to a smallest S1 PV shift, to achieve a maximal S15 "shift left" (while satisfying the S15 constraint), for maximal reliability improvement.

In operation (5), the system may update PV shifts such that if some read thresholds have higher calculated BER than default BER, the system can attempt to fix the PV shifts by applying more negative PV shifts "to the left". For example, suppose that WL group 5 has initial PV shifts (PV shifts before fix) of −29 DAC (e.g., −29, −29, −29, −29, −29, −29, −29, −29, −29, −29, −29, −29, −29, −29, −29), and the read thresholds Th5, Th11 have higher calculated BER than default BER. In this case, the system may attempt to fix the PV shifts by applying more negative shifts to the left, resulting in, for example, −31, −31, −31, −31, −30, −30, −30, −30, −30, −30, −30, −29, −29, −29, −29. It is noted that the S15 constraint is satisfied, because PV_S15V is not changed. In some implementations, the system may repeat 617-1 to 617-5 with the new PV shifts (instead of initial PV shifts). In some implementations, the system may perform "mini optimization" of read thresholds with less reads, in the range of −2 DAC to +2 DAC around fixed best read thresholds.

In operation (6), the system may modify programming parameters. If two consecutive iterations of PV shift fix for the same read threshold(s) do not improve BER, the system may add other programming parameters, e.g., start program voltage (VPGM) or program voltage step (ISPP), and modify the parameters by −1DAC. In some implementations, the system may repeat operation (1) to operation (5) with modified programming parameters and initial PV shifts. These operations can add additional programming parameters for PV levels optimization in order to allow improved programming accuracy with optimized program voltage window.

In operation (7), if optimization iterations (e.g., operation (1) to operation (5)), for some WL groups, reach a minimal S1 PV shift, without achieving optimization goal, the system may (i) recalculate initial PV shifts for relevant WL groups (as in previous operation (4) to operation (6)), (ii) set basic PV shifts to 75% of the VT budget margin, (iii) verify satisfaction of the step, and/or (iv) repeat operation (1) to operation (5) with new initial PV shifts and additional programming parameters optimization. In some implementations, the system can recalculate basic PV shifts as smaller percentage of VT budget margin (e.g., 70%, 65% and the like).

FIG. 6C illustrate a table illustrating example PV level shifts as a result of PV levels adaptation per row range, for each PV level, and additional device parameters in a QLC device (e.g., PV levels adaptation illustrated in FIG. 6A and FIG. 6B), according to some arrangements. Referring to FIG. 6C, Table 2 shows an exemplary PV level shifts per row range (e.g., row range 0-2, row range 3-40, . . . , row range 1100-1104), for each PV level (e.g., PV S1V, PV S2V, . . . , PV S15V) on a QLC device. Table 2 also contains offset values relative to device default value for parameters such as program voltage step (ISPP), maximal number of program pulses (NPP), start program voltage (VPGM), and the programming levels per state. In some implementations, the system may optimize the program parameters separately per row range to provide maximal reliability improvement.

FIG. 7A to FIG. 7D illustrate example results of distribution of fail bit counts (FBCs) after data retention (DR) for a QLC device according to some arrangements. FIG. 7A, FIG. 7B, FIG. 7C and FIG. 7D show probability density functions (PDFs) 710, 730, 750, 770 and complementary cumulative distribution functions (CCDFs) 720, 740, 760, 780 of FBC distributions for lower, middle, upper and top pages, respectively. FIG. 7A to FIG. 7D show exemplary reliability improvement for a QLC device, after data retention (DR) using VT optimizations according to some implementations. For example, the VT optimizations can improves endurance by greater than 50% on a QLC NAND device. The EOL DR stress condition here is 1Year@40 C retention, which is measured by comparing the BER distribution per every page type, and computing the BER threshold which is exceeded at probability of 1E-12. For default programming (see lines 712, 722, 732, 742, 752, 762, 772, 782), at 2K P/E cycles, the BER threshold is 728 at probability of 1E-12. When using the VT optimizations (see lines 711, 721, 731, 741, 751, 761, 771, 781) and cycling up to 3K P/E cycles, the maximal BER is even lower, and the BER threshold is 700 at probability of 1E-12. The small degradation of the VT optimization (3K) in top and upper pages compared to default (2K) do not have any effect on the reliability, since reliability is determined by the page with highest max FBC at probability of 1E-12, which is the lower page in this case.

Figures 8A, 8B:
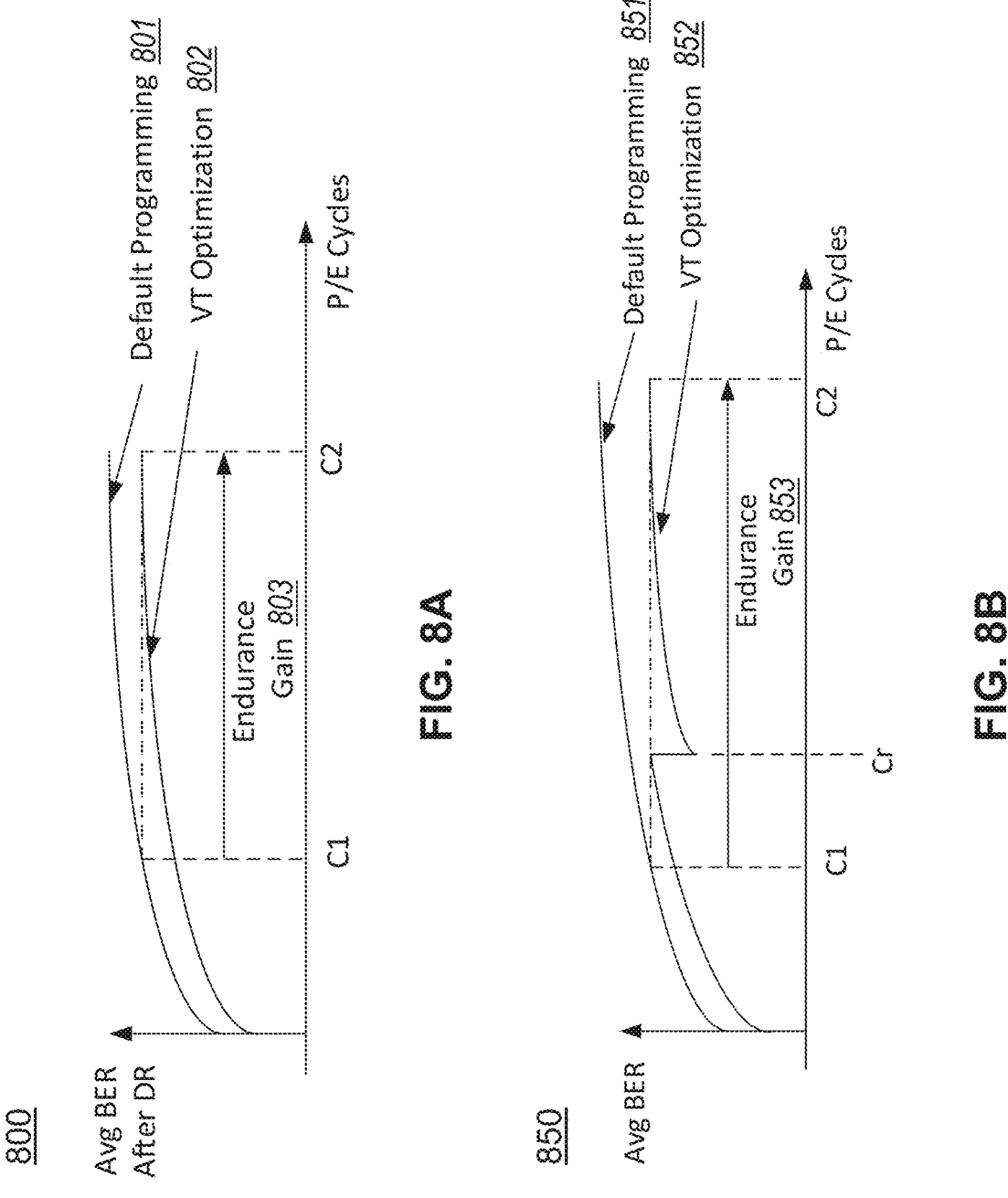
FIG. 8A and FIG. 8B illustrate example results of average bit error rate (BER) over program/erase (P/E) cycles after DR for a QLC device according to some arrangements.

FIG. 8A and FIG. 8B illustrate example results of average bit error rate (BER) over program/erase (P/E) cycles after DR for a QLC device according to some arrangements. FIG. 8A shows an exemplary evaluation result 800 of VT optimization (see line 802) according to some implementations versus default programming (see line 801) in terms of average BER after DR. FIG. 8B shows an exemplary evaluation result 850 of VT optimization (see line 852) according to some implementations versus default programming (see line 851) in terms of BER distribution as a function of P/E cycles, when the VT optimization uses different parameters on two cycle ranges (e.g., a first cycle range between C1 and Cr, and a second cycle range between Cr and C2).

FIG. 8A shows evaluation of VT optimization (see line 802) according to some implementations in terms of the reliability improvement by measuring the EOL DR average BER as a function of the P/E cycles. The endurance gain 803 in this example is 100*((C2/C1)−1) [%], which indicates that using the VT optimization the wear is lower, and the average BER increases in a slower slope compared to default programming (see line 801). As shown in FIG. 8A, the average BER that default programming EOL DR reaches after C1 P/E cycles is reached only at C2 P/E cycles by the VT optimization.

FIG. 8B shows evaluation of VT optimization (see line 852) in which PV and parameter optimization for reliability improvement can be performed separately on different cycle ranges. The motivation for separating the optimization into multiple cycle ranges is the effect of cycling on S1-budget and on BER, since the BER increases as a function of P/E cycles, the S1-budget also changes with cycling. That is, the available S1 budget for wear reduction and PV level shifts may be larger in low values of P/E cycles, and may decrease as the values of P/E cycles increase. Therefore, an aggressive optimization of PVs can be performed only for initial P/E cycles. Then, at some point the PV level shifts can be set differently (to slightly increase PVs), as to allow higher margin for the continuously decreasing S1-budget. Such optimization result is demonstrated in FIG. 8B, where program parameters are changed for P/E cycles greater than Cr, which means that two sets of parameters are used throughout the device lifespan. Using more cycle ranges, and separate optimizations per cycle range may provide higher endurance and reliability gains 853 for the VT optimization.

Figure 9:
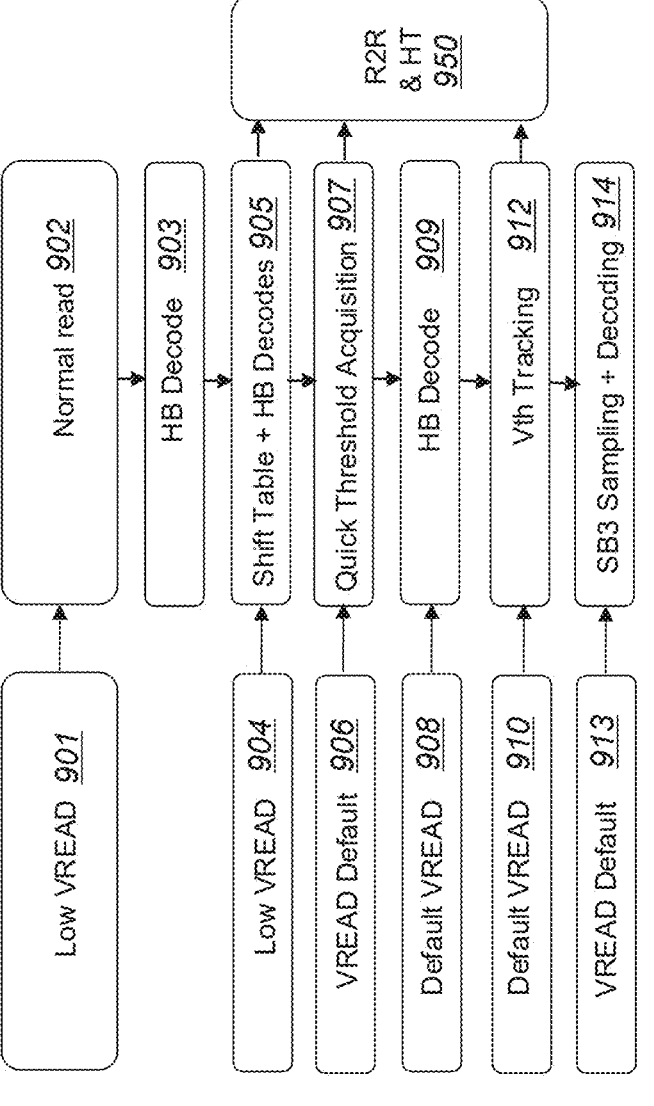
FIG. 9 illustrates a flowchart illustrating an example methodology for reading for a QLC device according to some arrangements.

FIG. 9 illustrates a flowchart illustrating an example methodology for reading for a QLC device for reliability improvement and reduced read disturb noise, according to some arrangements. Aggressive VT optimization for reliability improvement may require methods for reducing BER increase during many reads, and meet the requirements of read disturb (RD). In some implementations, a non-volatile memory system can reduce the RD noise by performing reads with low VBias (VREAD) most of the time, and use the default VBias only in case of a failure of read with low VBias.

Referring to FIG. 9, a reading method or process 900 begins in 901 by obtaining or determining, by a non-volatile memory system, a low VREAD (e.g., default read-Vbias). In 902, in some arrangements, the system can perform default reads (normal reads) using the low VREAD. For example, the system can use a low read-Vbias during the default reads, which are the reads with the thresholds that are compatible to PD stress, and valid right after programming.

In 903, in some arrangements, the system can perform hard decoding (HB decode). In case of failure in hard decoding, the system may use precomputed thresholds from a shift table. In 904 and 905, in some arrangements, the system can obtain a low VREAD (or default VREAD), and perform a hard decoding using the precomputed thresholds from a shift table. In 906, the system can still use a low VREAD (or default VREAD), and if all retries failed, in 907, the system may perform a quick threshold estimation or acquisition. In 908 and 909, the system use default read-Vbias (VREAD) and perform a hard decoding using the estimated thresholds. Eventually, the system may use a low VREAD during reads on start-of-life (SOL). In 910, the system may switch to a default VREAD possibly after quick threshold tracking in 912. In 913, the system may remain with a default VREAD for this block until the block is refreshed.

In 914, in some arrangements, the system can perform SB3 sampling and decoding. SB3 sampling refers to soft sampling with 3 bit resolution, obtained by performing 7 reads from target page, as to obtain soft information. This allows decoding with higher capabilities to cope well with higher BER of target page. In 950, in some arrangements, the system can perform R2R and History Table (HT) update. The R2R stands for row-to-row prediction. This allows prediction of optimal thresholds for a target row given thresholds of a different row in the block. The history table keep track of latest acquired thresholds (in a quantized manner), and the R2R jointly with HT may provide relevant read thresholds for all pages of same block (or other similar blocks).

FIG. 10 illustrates a flowchart illustrating an example methodology for programming according to some arrangements.

In some arrangements, the example methodology relates to a process 1000 for performing operations on a flash memory (e.g., flash memory module 202 in FIG. 2) by a circuit (e.g., programming circuit 220 or VT optimizer 223 or program parameter adapter 230 in FIG. 2) of a flash memory system (e.g., flash memory system 200 in FIG. 2).

In this example, the process 1000 begins in 1002 by determining, by one or more processors of a system, using first data relating to a sample set of non-volatile memory devices (e.g., DR databases, VT-scan databases), one or more program parameters of each of a plurality of rows of cells of a non-volatile memory. In some implementations, each of the plurality of rows may correspond to a word line. In some implementations, the one or more program parameters may include at least one of a program voltage window, a voltage threshold (VT) budget, a bit error rate (BER) per page (page BER), a BER per threshold, or a fail bit count (FBC). In some implementations, the plurality of rows may be divided into a plurality of row groups (e.g., row group 352), at least one of the plurality of row groups including two or more rows.

In 1004, in some arrangements, the system may be configured to adjust, using the first data, the one or more program parameters of each of the plurality of rows. Adjusting the one or more program parameters may include equalizing the one or more program parameters (e.g., VT budget, the page BER at data-retention (DR) end-of-life (EOL) stress) across the plurality of rows (e.g., rows or WL(0), WL(1), . . . , WL(80)).

In some implementations, in adjusting the one or more program parameters of each row, the system may adjusting the one or more program parameters of each row to cause a value of the one or more program parameters of each row (e.g., VT budget of each row in FIG. 3A) to be equal to a minimum value of the one or more program parameters of the plurality of rows (e.g., VT budget of $k^{th}$ row in FIG. 3A).

In some implementations, in adjusting the one or more program parameters of each row, the system may determine one or more program parameters of a first row group (e.g., row group 352), and adjust the one or more program parameters of the first row group. The system may adjust the one or more program parameters of the first row group to cause a minimum value of the one or more program parameters of the row group (e.g., VT budget of the row group 352 in FIG. 3B) to be equal to a minimum value of the one or more program parameters of the plurality of rows (e.g., VT budget of $k^{th}$ row in FIG. 3A).

In 1006, in some arrangements, the system may be configured to determine one or more programming voltages of each row based at least in part on the adjusted program parameters of the plurality of rows. In some implementations, in determining the one or more programming voltages of each row, the system may determine the one or more programming voltages of the first row group based at least in part on the adjusted program parameters of the first row group. For example, PV levels may be shifted by the voltage difference $$VTbudget(Th_1, n) - \min_{all\,rows} (VTbudget(Th_1))$$

according to Equation (2).

In some implementations, the system may collect data relating to voltage thresholds of the plurality of rows. The system may perform, based at least in part on the collected data, adjusting the one or more program parameters of each row and determining one or more programming voltages of each row. For example, the system may cycle several devices to EOL (e.g., 3K P/E cycles) and test with DR and generate (e.g., create, build) a VT distribution database based on results of the test (e.g., 501 in FIG. 5A), and perform an offsets fix to the existing DR VT-scans (e.g., VT distribution database) (e.g., 511 in FIG. 5B).

In some implementations, the system may determine a minimum value of program parameters (e.g., minPgFBC in 504 in FIG. 5A) for a plurality of pages of the first row group. The system may determine a maximum value of the program parameters (e.g., maxPgFBC in 504 in FIG. 5A) for the plurality of pages of the first row group. The system may determine whether a ratio of the maximum value to the minimum value (e.g., fbcRatio in 504 in FIG. 5A) is greater than a threshold (e.g., 505 in FIG. 5A). In response to determining that the ratio of the maximum value to the minimum value is greater than the threshold, the system may determine the one or more programming voltages of the first row group (e.g., 507 through 511). In response to determining that the ratio of the maximum value to the minimum value is smaller than or equal to the threshold, the system may determine one or more program parameters of a second row group and adjusting the one or more program parameters of the second row group (e.g., 506).

In some implementations, the system may determine program parameters for a plurality of threshold voltages in the first row group. In determining the one or more programming voltages of each row, the system may determine a first threshold voltage (e.g., $j^{th}$ threshold of minPgFBC in 507) with a lowest value of the program parameters in the first row group, the system may determine a second threshold voltage (e.g., it threshold of maxPgFBC in 507) with a highest value of the program parameters in the first row group, and shift one or more programming voltages between the first threshold voltage and the second threshold voltage in an identical direction which is either a positive direction (e.g., 510) or a negative direction (e.g., 509). In some implementations, the system may determine a first voltage level of the first threshold voltage (e.g., VSG offset for $j^{th}$ threshold of minPgFBC) among the plurality of threshold voltages. The system may determine a second voltage level of the second threshold voltage (e.g., VSG offset for $i^{th}$ threshold of maxPgFBC) among the plurality of threshold voltages. The system may determine the identical direction based at least in part on the first voltage level and the second voltage level. For example, in 509, the voltage level is shifted in a negative direction while in 510, the voltage level is shifted in a positive direction.

In 1008, in some arrangements, the system may be configured to program a first row of the plurality of rows using the one or more programming voltages of the first row.

3. Programming Non-Volatile Memory with Improved Write Performance

The NAND flash memory program/erase (P/E) cycles may create charge traps in memory cells. This charge trap may leak over time in a temperature dependent leakage rate, resulting in an increased BER and changes in the program states distribution, due to the retention effect. Recent 3D NAND structures can allow for either a single-shot programming, where all states are programmed at a single command (as done for example in TLC devices), or a multiple-stage programming, where the programming can be performed at multiple stages to achieve an accurate state programming with low STD of voltage thresholds of any state distribution, and achieve a low BER after programming (as done for example in higher density NAND (e.g. QLC or PLC). 3D NAND devices at growing density pose new challenges with QLC and even recently PLC with 4 and 5 bits per cell, respectively. This trend requires adaptation of programming and read methods with advanced signal processing in order to guarantee performance and reliability.

To address this problem, according to certain aspects, arrangements in the present disclosure relate to techniques for obtaining higher write performance under the same reliability requirements for non-volatile memory devices (e.g., NAND flash devices) by changing the NAND device parameters adaptively within the NAND block, and across the device lifespan using one or more processors (e.g., a program digital signal processor (DSP)). In some implementations, a non-volatile memory system (e.g., flash memory system 100, memory controller 102, program parameter adapter 130, or parameter optimizer 133) can modify, adjust or update program parameters (e.g., NAND die program parameters) for each row range (e.g., row group, row set, word line (WL) range, WL group, WL set) separately as to maximize program speed and keep the BER distribution within an acceptable limited (e.g., not crossing one or more thresholds). In some implementations, the system can select row groups and then perform optimization of program parameters for each row group.

In one aspect, the system can perform optimization of program parameters as an offline operation. That is, the optimization can be performed on a sample set of devices, and then the optimization results can be used for all devices used for a target product. The target product can simply set program parameters during programming as function of row index and/or WL index. With this offline optimization, it is possible that during implementation of the target product, there is no need to determine thresholds or measure BER because such thresholds are relevant for the offline optimization process. In other words, the program parameters can be a result of optimization and contribute to NAND performance improvement.

In one aspect, program parameter optimizations for performance improvement may be performed on a limited set of devices. However, after optimization of new parameters, the system may apply the new parameters to a wide range of devices for mass production. In order to achieve reliability in mass production, the system can use an optimization margin (e.g., margin of error) based on mass production data (e.g., mass production statistics, mass production margin).

In some implementations, in order to meet mass-production requirements (as a reliability metric for mass production reliability), such as die-sort yield success, the system can compute, calculate, or obtain a margin or a margin of error (e.g., a mass-production margin of BER) for WL-based optimization from a large collection of statistics with default programming on a large ensemble of dies, and translate the margin to optimization goals for a small set of local devices. Such translation can enable a tight optimization of performance improvement that can reach mass-production goals. In some implementations, the system can improve the write performance with row-dependent parameters, and utilize an available BER margin due to typical BER difference between rows, WLs, or layers of 3D NAND devices. In some implementations, the system can compute a mass-production margin from default programing BER distribution on a large set of devices, and transform the mass-production margin into a distribution on a small set of devices that are used for optimization. In some implementations, the system can perform the transformation from a retention BER distribution, so as to provide an EOL optimization margin.

In some implementations, the system can compute, calculate, estimate a mass-production margin (e.g., margin of error) for program parameter optimization on a small database based on measurements with default programming and read that are performed on a large ensemble of devices. Such large ensemble data may include statistics collected on many devices (e.g. greater than 1E6 dies). Such information may include a limited amount of data per die, and can be measured in low-temperature low-temperature (LTLT) or high-temperature high-temperature (HTHT) stress conditions. That is, an LTLT measurement can be, for example, programming at −40° C. and performing read at −40° C., and a HTHT measurement can be, for example, programming at 100° C. and performing read at 100° C. Since this data is collected during production, the system can minimize the amount of statistics that is stored such that the stored information may include for example state BER for two thresholds only, e.g., S14tS13 and S0tS1 per word line for all dies. The measurement of BER on S14tS13 may be the error rate of cells that were programmed to S14 and appear on S13, (S14 to S13 errors) which are single sided errors. Measuring this BER provides indication of retention BER response. BER of S0tS1 is (S0 to S1) the BER measured on S0 state (which is the erase state) to S1. This error type measures the level of read-disturb (RD) stress.

In some implementations, for reliability prediction of the BER distribution, the system can use two main parameters: (1) average BER; and (2) STD of BER. A Gaussian or a Laplacian distribution can be uniquely determined by these two parameters, and some other distributions that are usually used for NAND BER characterization can be also determined by these two parameters.

In some implementations, the system can compute, calculate, or estimate a mass production compensation conversion parameters by the following equations:

$$\mu_t(WL) = \mu_{mass-S14tS13}(WL) - \mu_{S14tS13-small}(WL); \text{ and} \quad \text{(Equation 9)}$$

$$\sigma_t^2(WL) = \sigma_{mass-S14tS13}^2(WL) - \sigma_{S14tS13-small}^2(WL), \quad \text{(Equation 10)}$$

where $\mu_{mass-S14tS13}(WL)$ and $$\sigma_{mass-S14tS13}^2(WL)$$

are average and variance of mass-production data provided for BER on threshold S14tS13 per WL, respectively. $\mu_{S14tS13-small}(WL)$ and $$\sigma_{S14tS13-small}^2(WL)$$

are average and variance of small available devices samples BER on threshold S14tS13 per WL, respectively. In some implementations, page BER expected distribution can be used for optimization of program parameters, and the system can estimate average and variance of page BER from single threshold measurements according to the following transformations:

$$t_\mu(WL) = \frac{\mu_{pg}(WL)}{R} - \mu_{S14tS13}(WL); \text{ and} \quad \text{(Equation 11)}$$

$$t_\sigma(WL) = \sqrt{\left(\frac{\sigma_{pg}(WL)}{R}\right)^2 - \sigma_{S14tS13}^2(WL)}, \quad \text{(Equation 12)}$$

where $\mu_{pg}(WL)$ and $\sigma_{pg}(WL)$ are average and STD of page BER per WL, respectively. For example, the normalization coefficient R=3.75 may be used for cases of equalized thresholds BER of a QLC device. In other cases, the ratio of average and STD of page BER and single threshold BER can be estimated from an available small database at high accuracy.

In some implementations, the system can use the two transformation schemes above to define, obtain, estimate optimization margins (e.g., mass-production margins) for the average and STD of the BER per row or per WL in the mass-production distribution domain. The system can transform the mass-production margin to a small database (DB) margin, which includes a few test devices only (e.g., the number of the test devices is less than the number of a plurality of devices for mass production data). The small DB margin can provide available degrees of freedom for optimizing the few test devices, such that the programming characteristics, e.g., the distribution per WL, can remain within a limits for full reliability on mass production.

In some implementations, the system (e.g., memory controller 102, program parameter adapter 130, parameter optimizer 133) can set program parameters dynamically as a function of target row and/or cycle count. In some implementations, each row (or word line (WL)) may have a different typical BER distribution and a different margin of BER. The system may select per-row program parameters (or programming parameters) such that program speed is accelerated, while keeping the resulting BER below a threshold (e.g., a BER threshold). The BER threshold for acceleration may be usually governed by the row with highest typical BER at end-of-life (EOL) stress conditions.

In some implementations, the system can perform an automatic optimization flow including parallel optimization and perform testing on multiple dies. In some implementations, some parts of the optimization (e.g., distributed optimization) can be distributed decentralized processing on multiple dies in parallel. During the distributed optimization, the system can randomly generate program parameter candidates, and evaluate the randomly generated parameter candidates are evaluated. The system can control generation of parameter candidates via a programming time estimator (e.g., a tProg estimator where tProg represents the time it takes to program (write) data to a single page in a NAND flash device). In some implementations, the programming time estimator may be a function of parameter values per parameter such that only valid random parameters (or parameter candidates or candidate parameters) are evaluated. The system can perform a programming time estimation (e.g., tProg estimation) available from stability testing around default parameter values.

In some implementations, the system can evaluate distributed processing by a central processor (e.g., one of a plurality of processors), and then evaluate successful parameter candidates (or candidate parameters) on a plurality of tested devices for a joint optimization of a single configuration candidate.

In some implementations, the system can perform programming with parameters that are configured to NAND die from a controller (e.g., memory controller 102, program parameter adapter 130, parameter optimizer 133) as a function of row range and/or cycle range. In some implementations, the controller can have larger memory (e.g., memory of memory controller 102) compared to NAND die and can hold common parameters for multiple dies that are usually connected to the same controller. The controller can set different parameters as a function of row number or cycle count, thereby performing a new set of optimizations for improving write performance which results in reduced tProg on rows/WLs with lowest BER distribution. The tProg reduction may usually increase BER, while the reliability is governed by the row with highest typical BER. Therefore, the system may apply the program acceleration (e.g., tProg reduction) to rows for which the typical BER can be increased. This effectively results in BER equalization across WLs, during end-of-life stress conditions.

Figure 11:
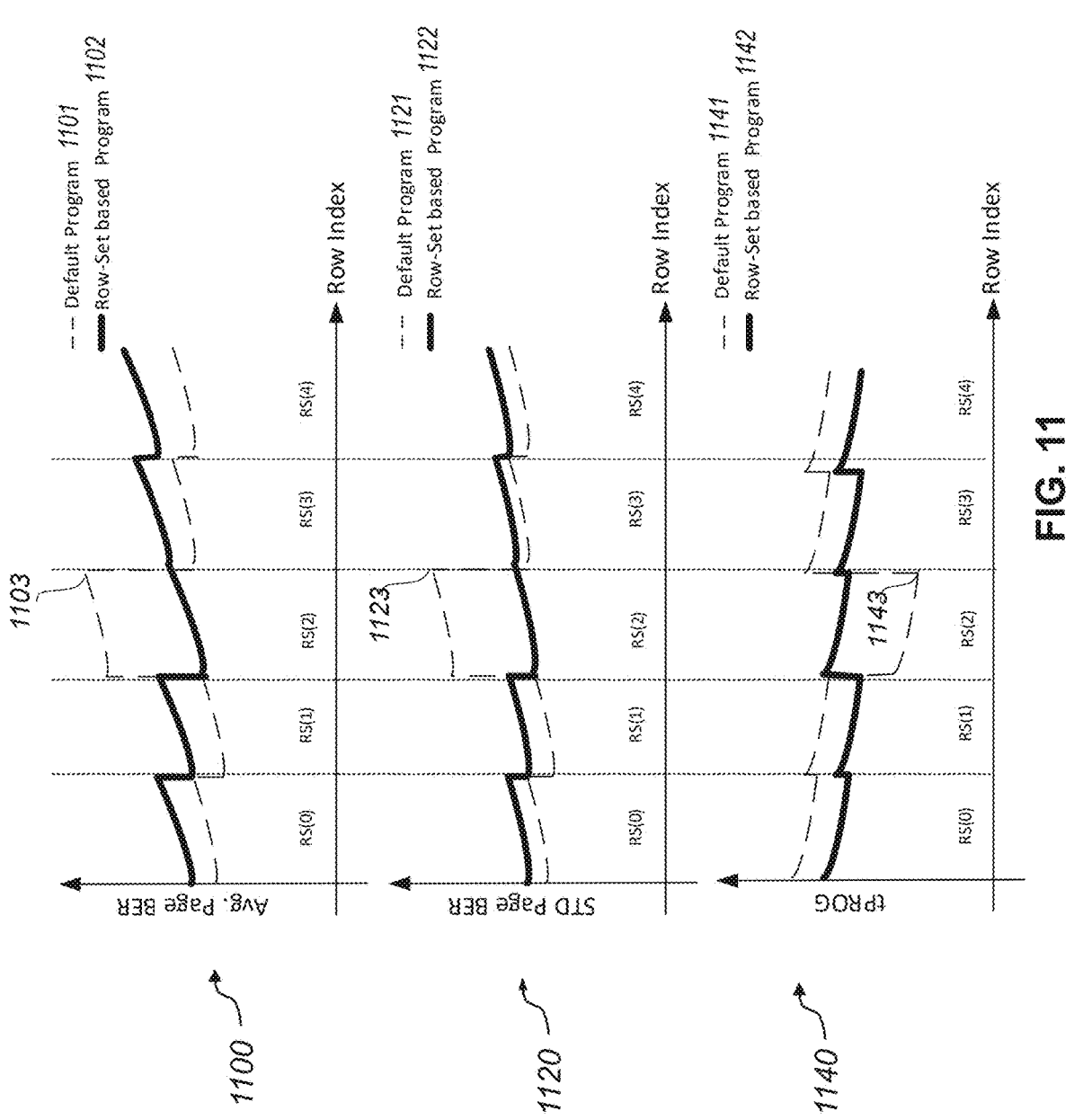
FIG. 11 illustrates an example distribution of page BER over a plurality of rows according to some arrangements.

FIG. 11 illustrates an example distribution of page BER (e.g., average page BER 1100, standard deviation (STD) page BER 1120) and an example distribution of programming times (e.g., tProg 1140) for over a plurality of rows according to some arrangements. As shown in FIG. 2, the example distribution of page BER and the example distribution of tProg may be a function of row index. In each distribution, programming according to some implementations (e.g., lines 1102, 1122, 1142 indicating row-set based program) and default programming (e.g., lines 1101, 1121, 1141 indicating default program) are compared. The plurality of rows may be divided into a plurality of row sets (e.g., RS(0), RS(1), RS(2), RS(3), RS(4)) in a full block, each row set including one or more rows.

In some implementations, a non-volatile memory system can perform separate optimization per row set. Referring to FIG. 11, the tProg distribution 1142 of the row-set based program shows that the average tProg over the full block is improved here (e.g., reduced compared to the tProg distribution 1141 of default program) due to separate optimization per row set. FIG. 11 shows an example of page BER distribution (e.g., average page BER 1100, STD page BER 1120) and an example of tProg distribution (e.g., tProg 1140) as a function of row, where in the $2^{nd}$ row set, denoted by RS(2), there is no room for BER increase because the $2^{nd}$ row set may include a row of highest average BER 1103, highest STD BER 1123, and lowest tProg 1143. In some implementations, the system can perform parameter optimization such that these rows on RS(2) can have a slower or longer tProg and achieve lower BER (e.g., lines 1102, 1122, 1142 on RS(2)). On other row sets, namely RS(0), RS(1), RS(3), RS(4), the system can reduce and optimize the tProg under BER increase that does not exceed the worst default row (e.g., lines 1102, 1122, 1142 on RS(0), RS(1), RS(3), RS(4)).

In some implementations, the system can perform distributed-device-based optimization (e.g., distributed optimization) more efficiently by synchronizing operations every several iterations. This means that optimization runs on different devices for several iterations of program parameter tuning search, and after several iterations, the process is synchronized, i.e. the target thresholds of BER increase and tProg targets per WL group are updated, and then the distributed processing continues. In some implementations, each device can perform standalone optimization on the first stage. After some iterations are done, the system can analyze a tProg gain for each device, and calculate (1) a lower limit of tProg gain and (2) an upper limit of tProg gain, based on all candidates statistics. The tProg gain may be an average tProg reduction. For example, the tProg gain can be calculated by tProg_gain=1−tProg(dsp)/tProg(default) where tProg(dsp) is the average tProg with program DSP (or programming with optimized program parameters), and tProg(default) is the average tProg with a default programming. The tProg gain can express the average write performance improvement over the default programming Candidate statistics include for example multiple sets of parameters candidate. A single candidate can specify for example ISPP offset value from default, VPGM offset from default, and many more parameters per WL group. Candidates are evaluated on many devices, and for each devices the evaluation results in tProg measurement and page BER (or per threshold BER) measurement. The collection of all candidates and their measurements is referred to as candidates statistics. In some implementations, the system can set values of the tProg lower limit and the tProg upper limit based on tProg values where the majority of the candidates statistics exists. The system can perform a search for optimal candidates (e.g., parameter candidates) using the tProg lower limit and the tProg upper limit, since the distributed optimization can generate random combination of parameters (e.g., parameter candidates) within the tProg lower limit and the tProg upper limit. The system can make the upper/lower limits of tProg narrower such that generation and evaluation of the parameter candidates can be more efficient. For example, if the system runs an automation (e.g., automated optimization) with 30 iterations, the system can define the fifth iteration (e.g., iteration 5) as a synchronized iteration such that after iteration 5 is reached, the system can calculate upper and lower limits of tProg based on a histogram of candidate statistics. In some implementations, for each row range, the system can define a tProg upper limit and a tProg lower limit.

In some implementations, the system can perform or advance a parameter optimization based on measured tProg statistics. In case of fast devices, a measured tProg value may be higher than an expected tProg value for a given candidate (e.g., parameter candidate or candidate parameter). In this case, the system can decrease the expected tProg value in the next iteration. For slow devices, a measured tProg value may be lower than an expected tProg value for a given parameter candidate. In this case, the system can increase the expected tProg value in the next iteration. In this manner, this calibration can ensure that on all devices parameter candidates remain between upper and lower limits of tProg defined at a synchronized iteration.

In some implementations, a system may include one or more processors. The one or more processors may be configured to determine, using first data relating to a sample set of non-volatile memory devices, one or more program parameters of a plurality of rows of cells of a non-volatile memory. The one or more processors may be configured to determine, using the first data, a first threshold of a first parameter of each row based at least in part on the one or more program parameters of the plurality of rows. The one or more processors may be configured to determine, by changing a programming time of each row, a set of parameters of each row that causes the first parameter not to cross the first threshold. The one or more processors may be configured to determine a second threshold of a second parameter of each row based at least in part on production information that includes production statistics of a plurality of dies as a result of mass production. The one or more processors may be configured to adjust the programming time of each row to cause the second parameter not to cross the second threshold. The one or more processors may be configured to program data to a first row of the plurality of rows using the set of parameters of the first row and the adjusted programming time of the first row.

In some implementations, each of the plurality of rows may correspond to a word line. In some implementations, the production statistics may include a collection of statistics obtained by at least one of programming on the plurality of dies with predetermined program parameters or reading from the plurality of dies with predetermined read parameters in program disturb stress.

In some implementations, the one or more program parameters may include at least one of an average programming time, an average of bit error rate (BER) per page (page BER), or a standard deviation of page BER. In some implementations, the first parameter may be a page BER. The one or more processors may be configured to determine the first threshold based at least in part on a row having a highest BER at end-of-life (EOL) stress conditions among the plurality of the rows.

In some implementations, the second parameter may be at least one of an average of bit error rate (BER) per page (page BER) or a standard deviation of page BER. In determining the second threshold, the one or more processors may be configured to convert a distribution of the second parameter in a mass production of non-volatile devices to a distribution of the second parameter in a plurality of non-volatile devices. In determining the second threshold, the one or more processors may be configured to convert the distribution of the second parameter in the plurality of non-volatile devices to a distribution of the second parameters in pages of the plurality of non-volatile devices. In some implementations, the set of candidate parameters may include at least one of an incremental step pulse programming (ISPP), a maximum number of pulses (NPP), or a program voltage (VPGM). Examples of candidate parameters are not limited thereto; candidate parameters can include any other NAND specific parameters that may be used.

In some implementations, the plurality of rows may be divided into a plurality of row groups, at least one of the plurality of row groups including two or more rows. In determining the set of parameters of each row, the one or more processors may be configured to determine a set of parameters of a first row group of the plurality of row groups. In determining the first threshold of the first parameter of each row, the one or more processors may be configured to determine a threshold of the first parameter of the first row group. In determining the second threshold of the second parameter of each row, the one or more processors may be configured to determine a threshold of the first parameter of the first row group.

In some implementations, in determining the set of parameters of each row, the one or more processors may be configured to randomly generate a plurality of sets of candidate parameters for the first row. The one or more processors may be configured to perform a test operation on the first row using each of the plurality of sets, the test operation including at least one of a write operation or a read operation. The one or more processors may be configured to determine whether a result of the test operation on the first row causes the first parameter not to cross the first threshold. In response to determining that the result of the test operation on the first row causes the first parameter not to cross the first threshold, the one or more processors may be configured to increase the programming time of on the first row. In response to determining that the result of the test operation on the first row causes the first parameter to cross the first threshold, the one or more processors may be configured to decrease the programming time of the first row. The one or more processors may be configured to determine a write performance of each of the plurality of sets based at least in part on the programming time of the first row. The one or more processors may be configured to select, from among the plurality of sets of candidate parameters, based at least in part on the write performance of each of the plurality of sets, the set of parameters of the first row.

Arrangements in the present disclosure have at least the following advantages and benefits. First, arrangements in the present disclosure can provide useful techniques for modifying, adjusting, or optimizing program parameters (e.g., NAND die program parameters) for each row range separately as to maximize program speed and keep the BER distribution within an acceptable limited.

Second, arrangements in the present disclosure can provide useful techniques for computing, calculating, or obtaining a margin or a margin of error (e.g., a mass-production margin of BER) for WL-based optimization from a large collection of statistics with default programming on a large ensemble of dies, and translating the margin to optimization goals for a small set of local devices. Such translation can enable a tight optimization of performance improvement that can reach mass-production goals.

Figure 12:
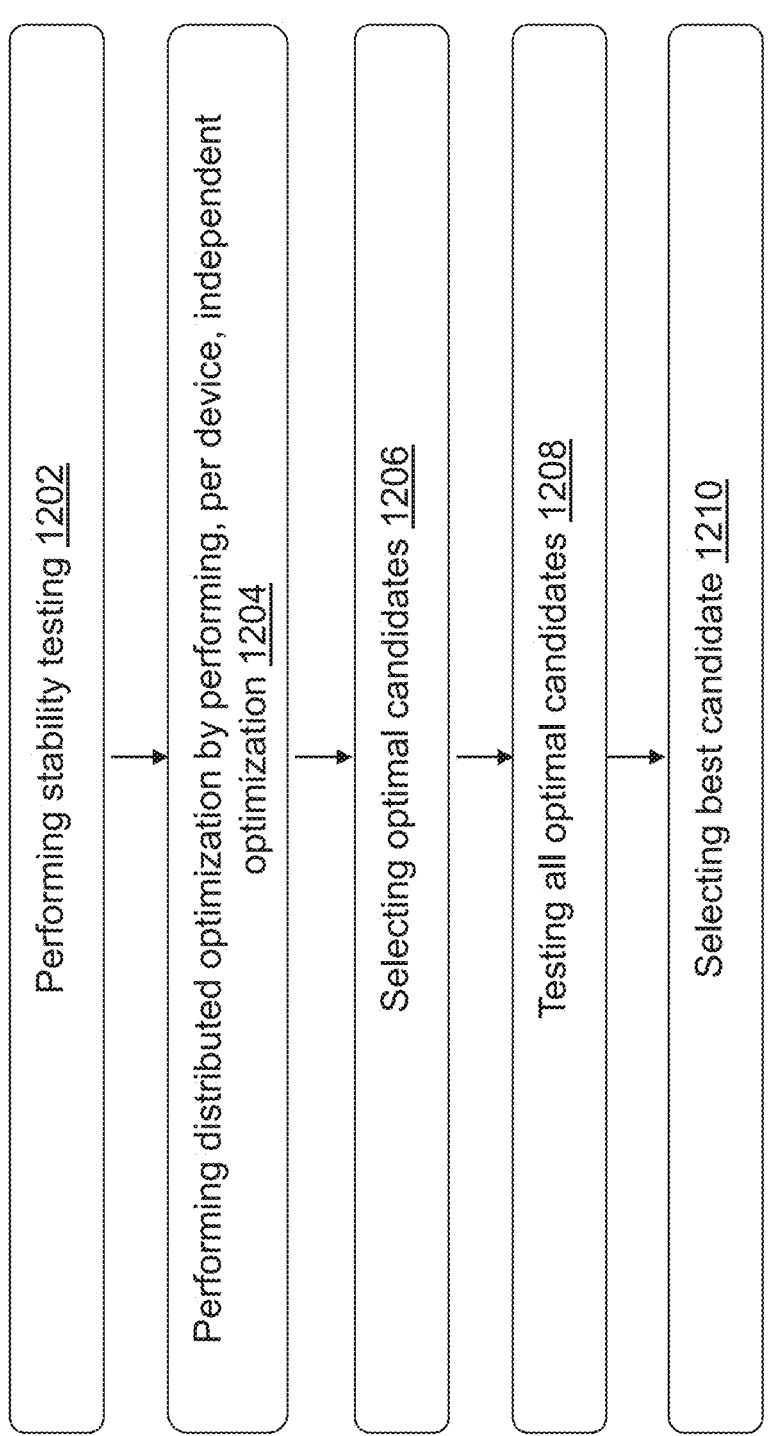
FIG. 12 illustrates a flowchart illustrating an example methodology for optimizing write performance for a non-volatile memory according to some arrangements.
Figure 13A:
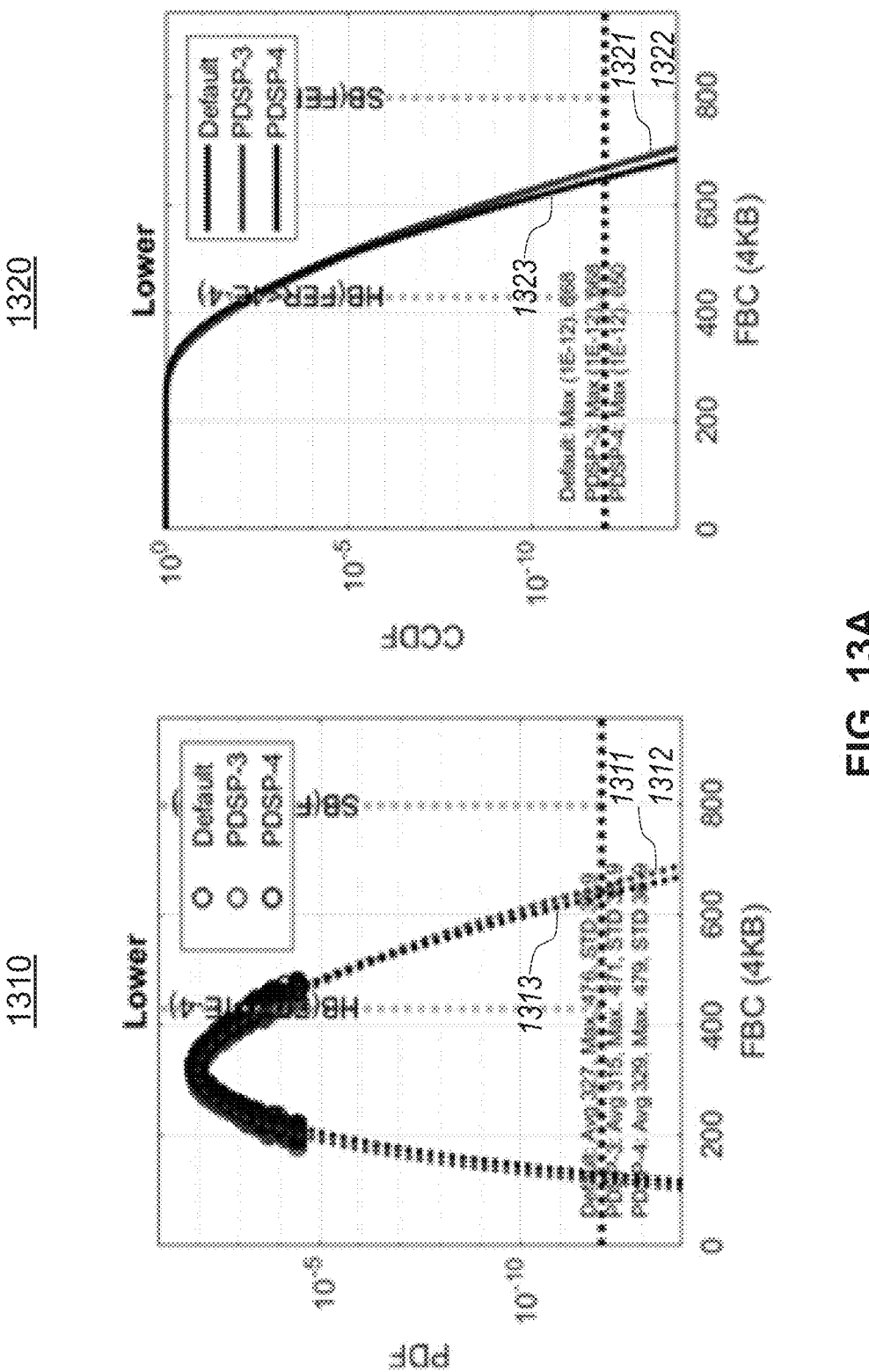
FIG. 13A to FIG. 13D illustrate example results of distribution of FBCs after data retention (DR) for a QLC device according to some arrangements.
Figure 13B:
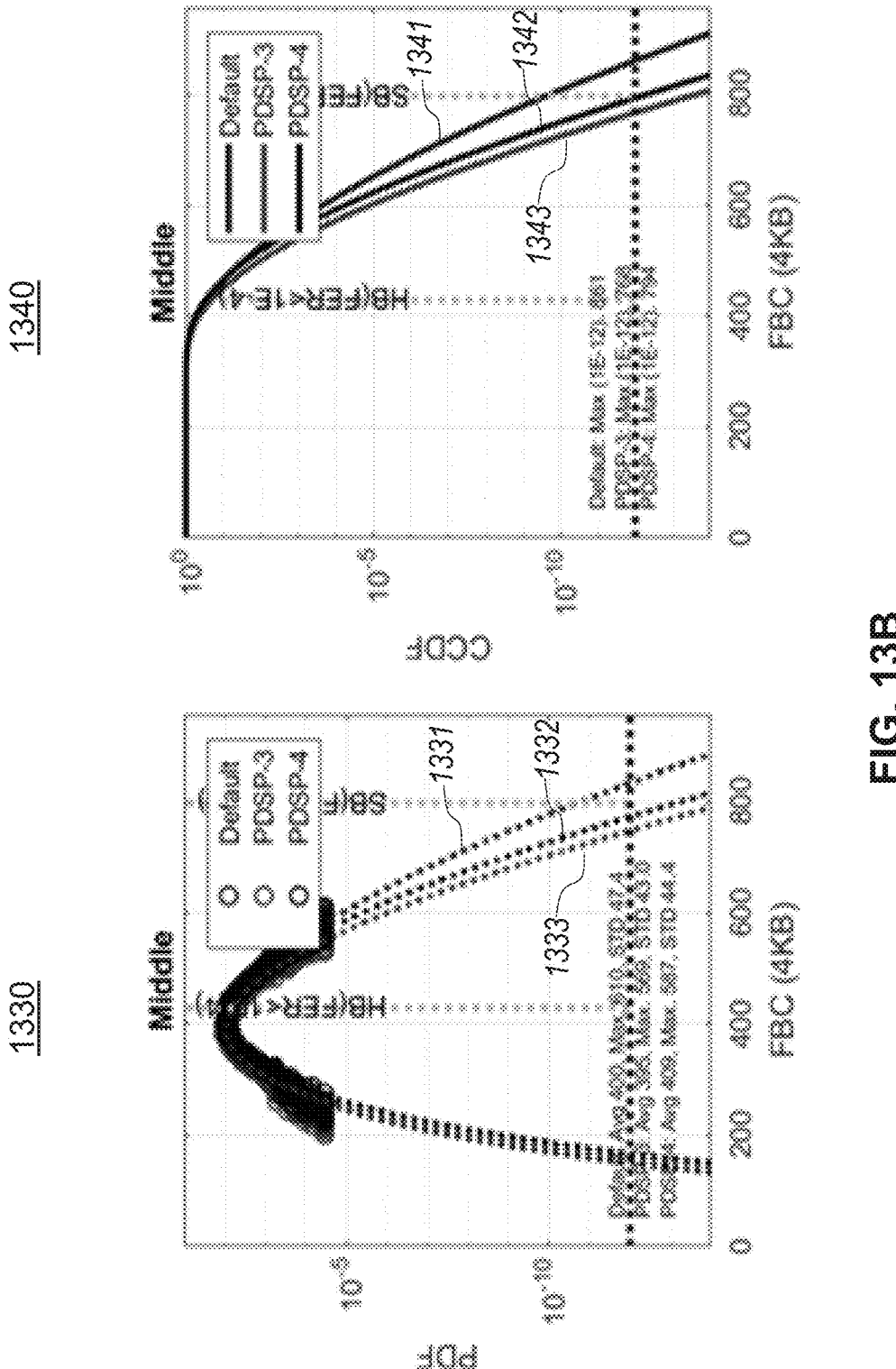
Figure 13C:
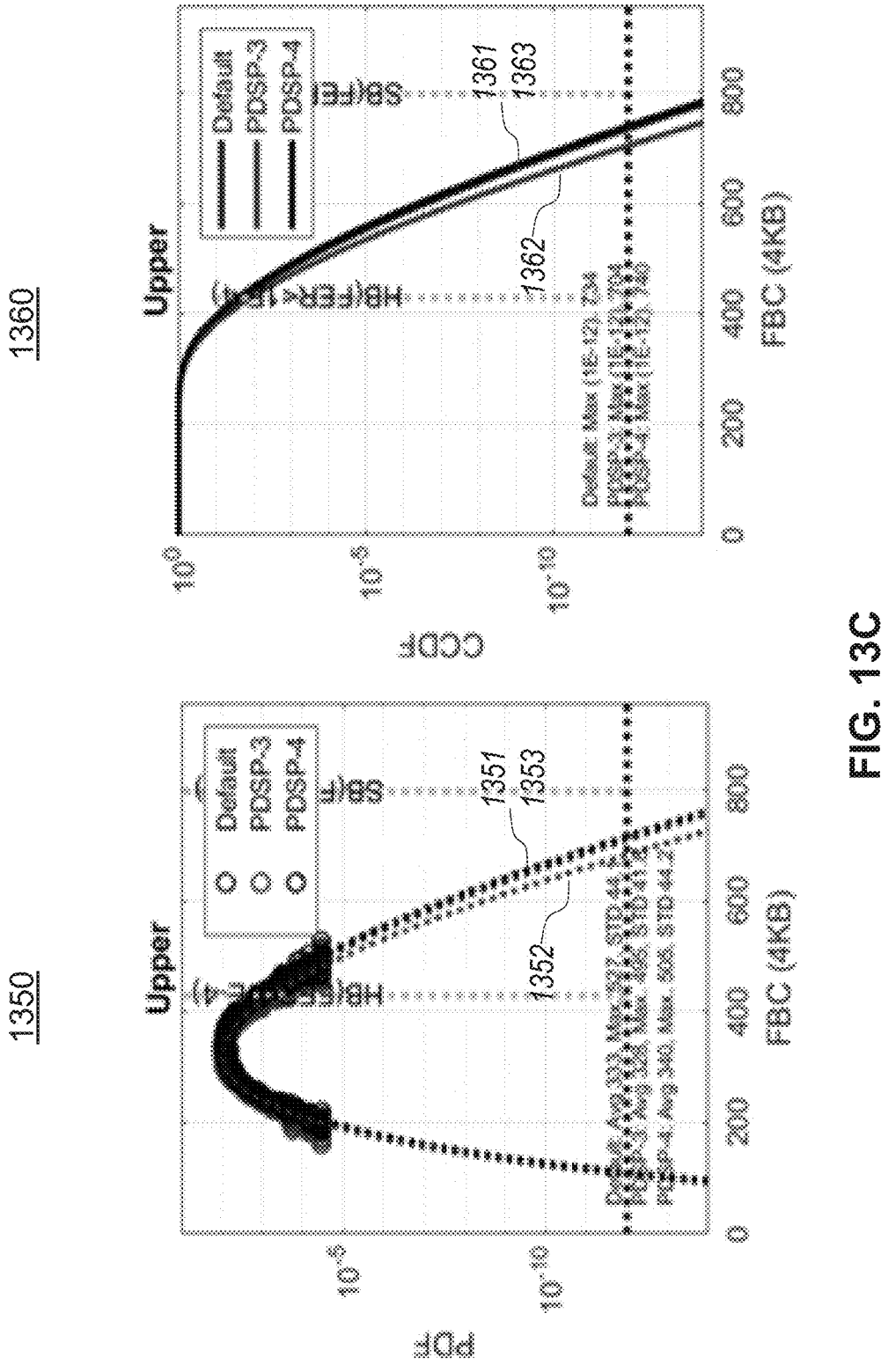
Figure 13D:
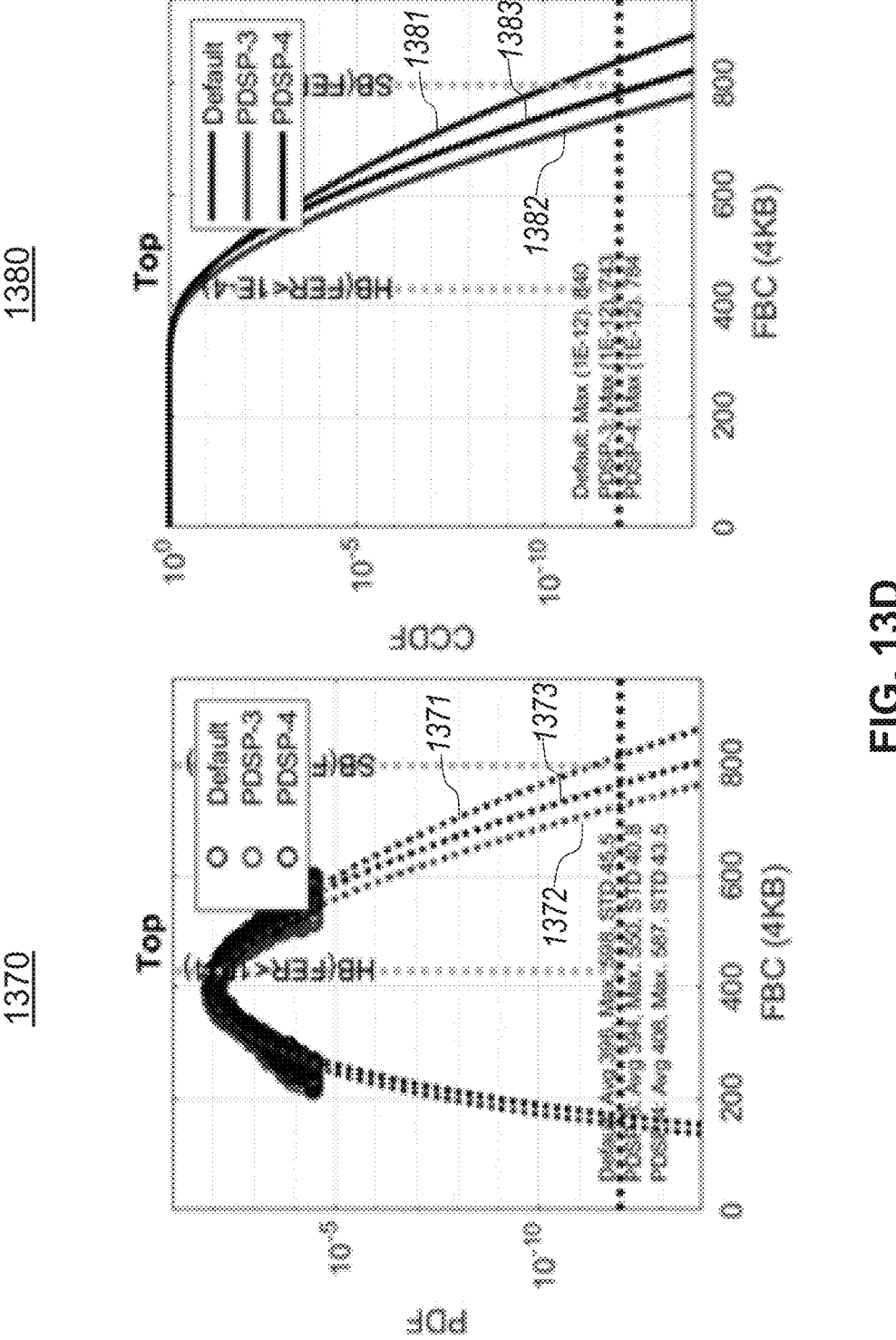

FIG. 12 illustrates a flowchart illustrating an example methodology for optimizing write performance for a non-volatile memory according to some arrangements. Referring to FIG. 12, an optimization method or process 1200 begins in 1202 by performing, by a non-volatile memory system (e.g., non-volatile memory system 100), stability testing by measuring the impact of each parameter (e.g., program parameter) on tProg and/or BER per row range (e.g., row group, row set, WL range, WL group, WL set). For example, for each parameter (or a parameter offset relative to a default value), the system may measure (1) BER average, (2) BER STD, and/or (3) tProg gain. The goal of this stability testing is to characterize the impact of every program parameter that is considered to be part of the parameter optimization flow. In the stability testing, the system can evaluate parameters that are considered for optimization individually over a span of valid values. The evaluation may include performing program and/or read with all valid values within the span, while recording the average BER and STD BER, and the tProg per value. Unselected parameters may include type (1) high BER (average and/or STD) measured for non-default parameter value on some devices; and/or type (2) values that change across the valid span and do not provide potential tProg reduction. In some cases, parameters of type (2) can take part of full optimization, as they may have impact on tProg or BER in combination with other parameters. In some implementations, the system can limit stability testing to the scope of individual parameters.

In some implementations, the system can perform tProg estimation by using the above results of stability testing, and create a tProg change function with respect to default tProg for every tested parameter. A good estimator for tProg change by multiple parameters may be a linear combination of tProg change of every individual parameter. In some implementations, the system can collect the stability testing statistics per row, including tProg (or statistics relating to tProg), thereby computing a tProg change by every parameter per row (or per WL), independently. In some implementations, the system can compute a tProg change by every parameter (or a combination of parameters) per row group (or per WL group).

In 1204, in some arrangements, the system may perform optimization by defining BER average/STD target limits (e.g., upper/lower limits of BER average, upper/lower limits of BER STD) per range. For example, the system may determine a first threshold (e.g., upper limit of BER average) based at least in part on a row having a highest BER (e.g., row having a highest average page BER 1103 and a highest STD page BER 1123) at end-of-life (EOL) stress conditions among the plurality of the rows. In some implementations, the system can perform optimization using distributed processing where only selected parameters are used, under a limited span for which BER is within an acceptable range and a sufficient tProg potential gain (e.g., a tProg gain greater than or equal to a threshold) is measured in the stability testing phase (e.g., 1202).

In some implementations, in 1204, the system can test random valid combinations of parameters. In some imple- DUTS. The parameter finally selected in 1210 may be a parameter candidate that provides the best write performance and meets the reliability requirements on all EOL stress conditions.

In some implementations, some of the parameters subject to optimization may include trim parameters of NAND die, which may have different default values. In some implementations, to save controller memory, the system can test only offset parameters on all devices. That is, a parameter candidate may include offset values with respect to device default values. An exemplary table of optimized program parameters per row range is shown in Table 3.

TABLE 3

| An exemplary configuration of a parameter optimization result with a best candidate, for a QLC device with two stage programming | | | | | | | | | | | | | | | |
| --- | --- | --- | --- | --- | --- | --- | --- | --- | --- | --- | --- | --- | --- | --- | --- |
| Rows: | | | | | | | | | | | | | | | |
| | 0-2 | 3-40 | 41-70 | 71-80 | 81-101 | 102-400 | 401-430 | 430-555 | 556-660 | 661-700 | 701-790 | 791-888 | 889-999 | 1000-1022 | 1023-1099 | 1100-1104 |
| ISPP Coarse | 1 | 2 | -1 | -1 | -1 | -1 | 2 | -1 | -1 | 0 | -2 | -1 | 2 | -2 | 1 | 0 |
| NPP Coarse | 0 | -1 | 2 | 3 | 3 | 3 | -1 | 2 | 3 | 0 | 4 | 2 | -3 | 4 | -2 | 0 |
| VPGM Coarse | 0 | 1 | 0 | -1 | -1 | -1 | 1 | 0 | -1 | 0 | -1 | 0 | 1 | -2 | 1 | 0 |
| ISPP Fine | 1 | 1 | -1 | -1 | -1 | -1 | 1 | -1 | 0 | 0 | 0 | -1 | -1 | -2 | 1 | 0 |
| NPP Fine | 0 | -2 | 2 | 3 | 3 | 3 | -2 | 2 | 3 | 0 | 4 | 2 | 0 | 4 | -2 | 0 |
| VPGM Fine | 0 | 0 | 0 | -1 | -1 | -1 | 0 | 0 | -1 | 0 | -1 | 0 | 2 | -2 | 1 | 0 | mentations, per DUT (device under test) optimization, the system may (1) iteratively attempt to meet the limits (e.g., BER average/STD target limits) by increasing or decreasing the tProg; (2) generating/obtaining, for each iteration, random N candidates (e.g., N parameter candidates) per range; (3) testing blocks based on criteria (e.g., criteria on BER) by performing write and read and saving the result statistics; and/or (4) if succeeded to meet the criteria, increasing the tProg target (per row range); otherwise decreasing tProg target (per row range).

In 1206, in some arrangements, the system may select optimal/best candidates (parameter candidates) that can meet the target limits or criteria set in 1204. In some implementations, the system may select best candidates for each DUT of a plurality of DUTs. In some implementations, the system may select best candidates of every device, and merge the best candidates with all devices.

In 1208, in some arrangements, the system may test all optimal/best candidates and collect statistics. The goal for 308 include keeping a small set of candidates which meet target performance gains on tProg and meet the reliability requirements on all tested devices. This test may result in a few valid parameter candidates common to all devices (DUTs), which are optimized with program parameters per WL range. In some implementations, the system may test all collected optimal candidates from the entirety of the plurality of DUTS. The system can evaluate the best candidate sets of parameters on several DUTs to test if the EOL stress conditions BER distribution is within an expected distribution.

In 1210, in some arrangements, the system can select a best parameter candidate from among the optimal/best parameter candidates, based on results of the test in 1208. In some implementations, the system may select a best parameter candidate (or best parameter candidates) from all common tested candidates from the entirety of the plurality of FIG. 13A to FIG. 13D illustrate example results of distribution of FBCs after data retention (DR) for a QLC device according to some arrangements. FIG. 13A, FIG. 13B, FIG. 13C and FIG. 13D show probability density functions (PDFs) 1310, 1330, 1350, 1370 and complementary cumulative distribution functions (CCDFs) 1320, 1340, 1360, 1380 of FBC distributions for lower, middle, upper and top pages, respectively. FIG. 13A to FIG. 13D show an exemplary evaluation of program parameter optimization on QLC devices that undergo data retention and 2000 program-erase (P/E) cycles. Lines 1311, 1321, 1331, 1341, 1351, 1361, 1371, 1381 represent the default programming BER distribution PDF and CDF per page type. Lines 1312, 1322, 1332, 1342, 1352, 1362, 1372, 1382 represent programming BER distribution PDF and CDF per page type with first program parameter candidates (PDSP-3). Lines 1313, 1323, 1333, 1343, 1353, 1363, 1373, 1383 represent programming BER distribution PDF and CDF per page type with second program parameter candidates (PDSP-4). As shown in FIG. 13A to FIG. 13D, the probability of high FBC is highest for default programming (e.g., lines 1311, 1321, 1331, 1341, 1351, 1361, 1371, 1381). The first program parameter candidates have lower probability of high BER (at the probability of 1E-12) (e.g., lines 1312, 1322, 1332, 1342, 1352, 1362, 1372, 1382). Both the first program parameter candidates (PDSP-3) and the second program parameter candidates (PDSP-4) provide greater than 10% tProg reduction, using same row ranges, but different program parameters. As a result, the parameter optimization configuration according to some implementations (e.g., both PDSP-3 and PDSP-4) can achieve greater than 10% write performance improvement with slight reliability improvement (e.g., no reliability degradation) as well.

FIG. 14 illustrates a flowchart illustrating an example methodology for optimizing programming based on mass production data for a non-volatile memory according to some arrangements. In some implementations, a non-volatile memory system (e.g., memory system 100) can compute a mass-production margin (e.g., margin of error) for a small device sample, to be used for program parameter optimization.

Referring to FIG. 14, a program parameter optimization method or process 1400 begins in 1401 by choosing, determining, accessing, by a non-volatile memory system, a small database and perform a default program and/or a read on many blocks. In some implementations, the system may prepare, create, build, generate a small database by performing program/read operations in a target stress condition on several test devices.

In 1402, in some arrangements, the system can compute, calculate, determine, estimate single threshold conversion parameters for conversion from the small database to a mass-production database. The single threshold conversion parameters may include $\mu_t(WL)$, $\sigma_t^2(WL)$ in Equation (9) and Equation (10). In some implementations, the system can compute a transformation from the small database to a mass-production database using $\mu_t(WL)$, $\sigma_t^2(WL)$.

In 1403, in some arrangements, the system can compute, calculate, determine, estimate full-page conversion parameters for conversion from a single threshold distribution to a full-page distribution using the small database. The full-page conversion parameters may include and $t_\mu(WL)$, $t_\sigma(WL)$ in Equation (11) and Equation (12). The system can compute a transformation from few read thresholds to page BER distribution using $t_\mu(WL)$, $t_\sigma(WL)$.

In 1404, in some arrangements, the system can compute, calculate, determine, estimate a full-page margin (e.g., margins of error) on a mass-production full-page distribution (referred to as "mass production margin"). In some implementations, the system can set, determine, estimate, calculate a mass production margin for obtaining reliability on mass-production devices. An example for a mass production margin is given by:

$$AVG_{margin}(WL) = \sum_{WL} \frac{1}{N_{WL}} \mu_{mp}(WL) + 1.5 \cdot STD(\mu_{mp}) - |n_\mu(WL)|; \text{ and} \quad (5)$$

$$STD_{margin}(WL) = \sum_{WL} \frac{1}{N_{WL}} \sigma_{mp}(WL) + 1.5 \cdot STD(\sigma_{mp}) - |n_\sigma(WL)|, \quad (6)$$

where $N_{WL}$ is the number of WLs, and $\mu_{mp}(WL)$ and $\sigma_{mp}(WL)$ are the mass production devices distribution average and STD. The distribution per WL may be different, and may provide a room for optimization, since the reliability is usually determined by a worst WL, e.g., the WL with highest BER. For increasing the confidence in the specified margin, the estimated transformation noise components $|n_\mu(WL)|$ and $|n_\sigma(WL)|$ are subtracted from the margins, thereby creating a higher confidence mass-production margin. There may be different methods for computation of the noise components. One exemplary method is to test the transformation accuracy using separate sets of mass production samples from different sources, and the difference between estimated coefficients can be used as the estimation noise.

In 1405, in some arrangements, the system can compute, calculate, determine, estimate a mass-production single threshold margin of single threshold average and STD from the full-page margin.

In 1406, in some arrangements, the system can compute, calculate, determine, estimate a small database single-threshold margin of single threshold average and STD from the mass-production single threshold margin (using conversion parameters). In some implementations, from a specified mass-production margin, the system can compute the equivalent margin for a small database. The system can convert the mass-production full-page margin into the few thresholds equivalent margin (e.g., small database single threshold margin), using $t_\mu(WL)$, $t_\sigma(WL)$. The system can then convert from the mass-production distribution to the small database distribution by using $\mu_t(WL)$, $$\sigma_t^2(WL).$$

In 1407, in some arrangements, the system can compute, calculate, determine, estimate a small database full page margin of full-page average and STD from the small database single-threshold margin. In some implementations, the system can compute the small database margin in full page domain (as a small data full page margin) by conversion of few thresholds margin (e.g., small database single-threshold margin) to the small database full page margin.

Figure 15:
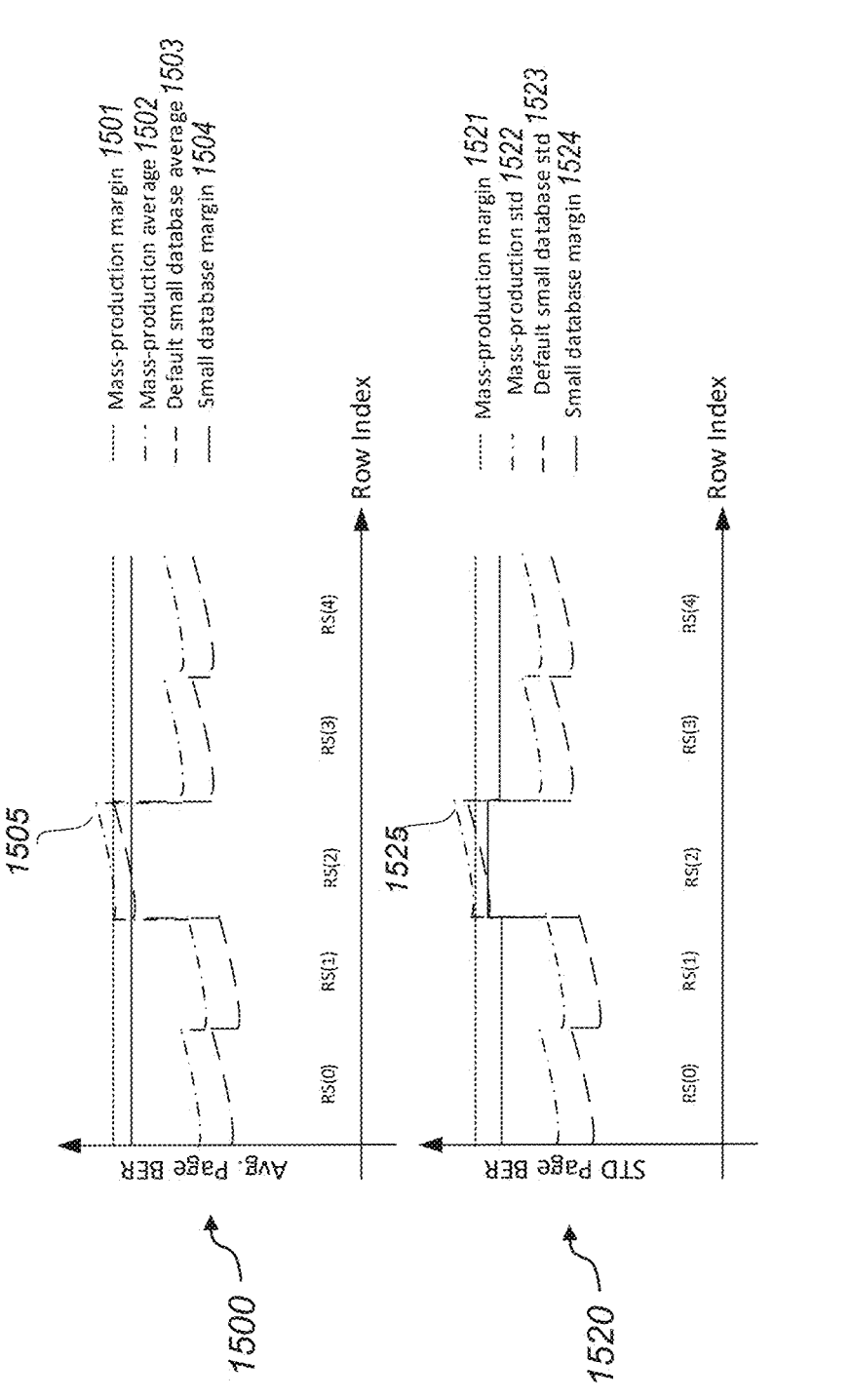
FIG. 15 illustrates an example distribution of page BER over a plurality of rows according to some arrangements.

FIG. 15 illustrates an example distribution of page BER over a plurality of rows according to some arrangements according to some arrangements. FIG. 15 shows an example distribution of page BER (e.g., average 1500 and STD 1520) for mass production and small databases over the plurality of rows. FIG. 15 also shows mass production margins (e.g., lines 1501, 1521 indicating average page BER and STD page BER, respectively), a mass production average page BER (e.g., line 1502), a mass production STD page BER (e.g., line 1522), a default small database average page BER (e.g., line 1503), a default small database STD page BER (e.g., line 1523), and small database margins (e.g., lines 1504, 1525 indicating average page BER and STD page BER, respectively). The plurality of rows may be divided into a plurality of row sets (e.g., RS(0), RS(1), RS(2), RS(3), RS(4)) in a full block, each row set including one or more rows.

Referring to FIG. 15, the mass-production optimization margin (e.g., lines 1501, 1521 indicating average page BER and STD page BER, respectively) can provide the optimization boundaries for a small-database such that after applying program parameter optimization the mass-production yield requirements can be met. In FIG. 15, an exemplary distribution of a small database average (e.g., line 1503) and a small database STD (e.g., line 1523) of page BER per row is provided, in comparison to the large database of mass-production default distribution including a mass-production average (e.g., line 1502) and a mass-production STD (e.g., line 1522) of page BER per row. The small-database margin (e.g., lines 1504, 1524 indicating average page BER and STD page BER, respectively) can be computed to provide the degrees of freedom for optimization of program parameters. As shown in FIG. 15, in the $2^{nd}$ row set, denoted by RS(2), there is no room for BER increase because the $2^{nd}$ row set may include a row of highest average BER 1505 and highest STD BER 1525. In some implementations, the system can perform parameter optimization such that these rows on RS(2) can have a slower or longer tProg and achieve lower BER (e.g., lines 1503, 1523) on RS(2)) below the mass-production margin (e.g., lines 1501, 1521). On other row sets, namely RS(0), RS(1), RS(3), RS(4), the system can reduce and optimize the tProg under BER increase that does not exceed the worst default row (e.g., lines 1503, 1523 on RS(0), RS(1), RS(3), RS(4)).

FIG. 16 illustrates a flowchart illustrating an example methodology for optimizing write performance for a non-volatile memory according to some arrangements. In some arrangements, the example methodology relates to a process 1600 for performing operations on a flash memory (e.g., flash memory module 104 in FIG. 1B) by a circuit (e.g., programming circuit 120, VT optimizer 123, program parameter adapter 130, or parameter optimizer 133 in FIG. 1B) of a flash memory system (e.g., flash memory system 100 in FIG. 1B).

In this example, the process 1600 begins in 1602 by determining, by one or more processors of a system, using first data relating to a sample set of non-volatile memory devices (e.g., DR databases, VT-scan databases), one or more program parameters of a plurality of rows of cells of a non-volatile memory. In some implementations, each of the plurality of rows may correspond to a word line. The one or more program parameters may include at least one of an average programming time, an average page BER (e.g., average page BER 1100), or a standard deviation of page BER (e.g., STD page BER 1120). In some implementations, the plurality of rows may be divided into a plurality of row groups (e.g., RS(0), RS(1), RS(2), RS(3), RS(4)), at least one of the plurality of row groups including two or more rows.

In 1604, in some arrangements, the system may be configured to determine, using the first data, a first threshold of a first parameter (e.g., upper/lower limits of tProg, upper/lower limits of BER average) of each row based at least in part on the one or more program parameters of the plurality of rows. In some implementations, the first parameter may be a page BER. The system may determine the first threshold (e.g., upper limit of BER average) based at least in part on a row having a highest BER (e.g., row having a highest average page BER 1103 and a highest STD page BER 1123) at end-of-life (EOL) stress conditions among the plurality of the rows (e.g., 1204 in FIG. 12).

In 1606, in some arrangements, the system may be configured to determine, by changing a programming time of each row, a set of parameters of each row that causes the first parameter not to cross the first threshold. For example, the system may determine a set of parameter candidates by increasing or decreasing the tProg to meet the limits or thresholds (e.g., BER average/STD target limits), e.g., 1204 in FIG. 12, In some implementations, in determining the set of parameters of each row, the system may determine a set of parameters of a first row group (e.g., RS(0)) of the plurality of row groups. In determining the first threshold of the first parameter of each row, the system may determine a threshold of the first parameter of the first row group (e.g., RS(0)).

In 1608, in some arrangements, the system may be configured to determine a second threshold of a second parameter of each row (e.g., mass-production margin indicated by lines 1501, 1521 in FIG. 15) based at least in part on production information that includes production statistics of a plurality of dies as a result of mass production (e.g., mass production average and STD of page BER). In some implementations, the production statistics may include a collection of statistics obtained by at least one of programming on the plurality of dies with predetermined program parameters or reading from the plurality of dies with predetermined read parameters in program disturb stress. In determining the second threshold of the second parameter of each row, the system may determine a threshold of the first parameter of the first row group (e.g., RS(0)).

In some implementations, the second parameter may be at least one of an average of bit error rate (BER) per page (page BER) or a standard deviation of page BER. In determining the second threshold, the system may convert a distribution of the second parameter in a mass production of non-volatile devices to a distribution of the second parameter in a plurality of non-volatile devices. In determining the second threshold, the system may convert the distribution of the second parameter in the plurality of non-volatile devices to a distribution of the second parameters in pages of the plurality of non-volatile devices. For example, the system can compute a transformation from the small database to a mass-production database using $$\mu_t(WL), \sigma_t^2(WL)$$

using Equation (9) and Equation (10).

In 1610, in some arrangements, the system may be configured to adjust the programming time of each row to cause the second parameter not to cross the second threshold. For example, referring to FIG. 15, on the row sets RS(0), RS(1), RS(3), RS(4), the system can reduce and optimize the tProg under BER increase that does not exceed the worst default row (e.g., lines 1503, 1523 on RS(0), RS(1), RS(3), RS(4)).

In 1612, in some arrangements, the system may be configured to program data to a first row of the plurality of rows using the set of parameters of the first row and the adjusted programming time of the first row.

In some implementations, in determining the set of parameters of each row, the system may randomly generate a plurality of sets of candidate parameters for the first row. In some implementations, the set of candidate parameters may include at least one of an incremental step pulse programming (ISPP), a maximum number of pulses (NPP), or a program voltage (VPGM). E.g., Table 3. The system may perform a test operation on the first row using each of the plurality of sets, the test operation including at least one of a write operation or a read operation. The system may determine whether a result of the test operation on the first row causes the first parameter not to cross the first threshold. In response to determining that the result of the test operation on the first row causes the first parameter not to cross the first threshold, the system may increase the programming time of on the first row. For example, referring to FIG. 15, on the row sets RS(0), RS(1), RS(3), RS(4), the system can reduce the tProg under BER increase that does not exceed the worst default row (e.g., lines 1503, 1523 on RS(0), RS(1), RS(3), RS(4)). In response to determining that the result of the test operation on the first row causes the first parameter to cross the first threshold, the system may decrease the programming time of the first row. For example, referring to FIG. 15, the system can perform parameter optimization such that these rows on RS(2) can have a slower or longer tProg and achieve lower BER (e.g., lines 1503, 1523) on RS(2)) below the mass-production margin (e.g., lines 1501, 1521). The system may determine a write performance of each of the plurality of sets based at least in part on the programming time of the first row. The system may select, from among the plurality of sets of candidate parameters, based at least in part on the write performance of each of the plurality of sets, the set of parameters of the first row.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A system, comprising
one or more processors configured to:
   determine, using first data relating to a sample set of non-volatile memory devices, one or more program parameters of each of a plurality of rows of cells of a non-volatile memory;
   adjust, using the first data, the one or more program parameters of each of the plurality of rows by equalizing the one or more program parameters across the plurality of rows, wherein the one or more program parameters comprise at least one of a program voltage window, a voltage-threshold (VT) budget, a bit error rate (BER) per page (page BER), a BER per threshold, or a fail bit count (FBC);
   determine one or more programming voltages of each row based at least in part on the adjusted program parameters of the plurality of rows; and
   program a first row of the plurality of rows using the one or more programming voltages of the first row.

2. The system of claim 1, wherein each of the plurality of rows corresponds to a word line.

3. The system of claim 1, wherein the one or more processors are further configured to:
   collect data relating to voltage thresholds of the plurality of rows; and
   perform, based at least in part on the collected data, adjusting the one or more program parameters of each row and determining one or more programming voltages of each row.

4. The system of claim 1, wherein in adjusting the one or more program parameters of each row, the one or more processors are configured to:
   adjust the one or more program parameters of each row to cause a value of the one or more program parameters of each row to be equal to a minimum value of the one or more program parameters of the plurality of rows.

5. The system of claim 1, wherein
   the plurality of rows are divided into a plurality of row groups, at least one of the plurality of row groups comprising two or more rows, and
   in adjusting the one or more program parameters of each row, the one or more processors are configured to:
      determine one or more program parameters of a first row group; and
      adjust the one or more program parameters of the first row group.

6. The system of claim 5, wherein the one or more processors are configured to:
   adjust the one or more program parameters of the first row group to cause a minimum value of the one or more program parameters of the row group to be equal to a minimum value of the one or more program parameters of the plurality of rows, and
   determine the one or more programming voltages of each row by determining the one or more programming voltages of the first row group based at least in part on the adjusted program parameters of the first row group.

7. The system of claim 5, wherein the one or more processors are further configured to:
   determine a minimum value of program parameters for a plurality of pages of the first row group;
   determine a maximum value of the program parameters for the plurality of pages of the first row group;
   determine whether a ratio of the maximum value to the minimum value is greater than a threshold;

in response to determining that the ratio of the maximum value to the minimum value is greater than the threshold, determine the one or more programming voltages of the first row group; and
   in response to determining that the ratio of the maximum value to the minimum value is smaller than or equal to the threshold, determine one or more program parameters of a second row group and adjusting the one or more program parameters of the second row group.

8. The system of claim 5, wherein the one or more processors are further configured to:
   determine program parameters for a plurality of threshold voltages in the first row group; and
   determine the one or more programming voltages of each row by:
      determining a first threshold voltage with a lowest value of the program parameters in the first row group;
      determining a second threshold voltage with a highest value of the program parameters in the first row group; and
      shifting one or more programming voltages between the first threshold voltage and the second threshold voltage in an identical direction which is either a positive direction or a negative direction.

9. The system of claim 1, the one or more processors are further configured to:
   determine, by changing a programming time of each row, a set of parameters of each row that do not cause a first parameter to cross a first threshold; and
   program the first row of the plurality of rows using the one or more programming voltages of the first row and the determined set of parameters of the first row.

10. A method, comprising:
   determining, by one or more processors of a system, using data-retention data obtained from end-of-life evaluation of a sample set of a plurality of non-volatile memory devices, one or more program parameters of each of a plurality of rows of cells of a non-volatile memory;
   adjusting, by the one or more processors, using the data-retention data, the one or more program parameters of each of the plurality of rows, wherein adjusting the one or more program parameters comprises equalizing the one or more program parameters across the plurality of rows;
   determining, by the one or more processors, one or more programming voltages of each row based at least in part on the adjusted program parameters of the plurality of rows; and
   programming, by the one or more processors, a first row of the plurality of rows using the one or more programming voltages of the first row.

11. The method of claim 10, wherein each of the plurality of rows corresponds to a word line.

12. The method of claim 10, wherein the one or more program parameters comprise at least one of a program voltage window, a voltage-threshold (VT) budget, a bit error rate (BER) per page (page BER), a BER per threshold, or a fail bit count (FBC).

13. The method of claim 10, further comprising:
   collecting data relating to voltage thresholds of the plurality of rows; and
   performing, based at least in part on the collected data, adjusting the one or more program parameters of each row and determining one or more programming voltages of each row.

14. The method of claim 10, adjusting the one or more program parameters of each row comprises:

adjusting the one or more program parameters of each row to cause a value of the one or more program parameters of each row to be equal to a minimum value of the one or more program parameters of the plurality of rows.

15. The method of claim 10, wherein the plurality of rows are divided into a plurality of row groups, at least one of the plurality of row groups comprising two or more rows, and adjusting the one or more program parameters of each row comprises:

determining one or more program parameters of a first row group; and adjusting the one or more program parameters of the first row group.

16. The method of claim 15, wherein the one or more program parameters of the first row group are adjusted to cause a minimum value of the one or more program parameters of the row group to be equal to a minimum value of the one or more program parameters of the plurality of rows, and determining the one or more programming voltages of each row comprises:

determining the one or more programming voltages of the first row group based at least in part on the adjusted program parameters of the first row group.

17. The method of claim 15, further comprising:

determining a minimum value of program parameters for a plurality of pages of the first row group;

determining a maximum value of the program parameters for the plurality of pages of the first row group;

determining whether a ratio of the maximum value to the minimum value is greater than a threshold;

in response to determining that the ratio of the maximum value to the minimum value is greater than the threshold, determining the one or more programming voltages of the first row group; and in response to determining that the ratio of the maximum value to the minimum value is smaller than or equal to the threshold, determining one or more program parameters of a second row group and adjusting the one or more program parameters of the second row group.

18. The method of claim 15, further comprising:

determining program parameters for a plurality of threshold voltages in the first row group wherein determining the one or more programming voltages of each row comprises:

determining a first threshold voltage with a lowest value of the program parameters in the first row group;

determining a second threshold voltage with a highest value of the program parameters in the first row group; and shifting one or more programming voltages between the first threshold voltage and the second threshold voltage in an identical direction which is either a positive direction or a negative direction.

19. A system, comprising:

a NAND memory including a plurality of word line (WL) groups; and a controller configured to:

determine one or more first program parameters of each of a plurality of rows of cells of a non-volatile memory;

adjust the one or more first program parameters of each of the plurality of rows by equalizing the one or more first program parameters across the plurality of rows, wherein the one or more first program parameters comprise at least one of a program voltage window, a voltage-threshold (VT) budget, a bit error rate (BER) per page (page BER), a BER per threshold, or a fail bit count (FBC);

determine one or more second program parameters per WL group wherein the one or more second program parameters comprise at least one of programming voltage (PV), start program voltage (VPGM), or program voltage step (ISPP);

determine one or more PVs per WL group based at least in part on the one or more first and second program parameters; and program one or more blocks of the NAND memory using the one or more second program parameters per WL group.

* * * * *